United States Patent
Millington et al.

(10) Patent No.: US 9,348,354 B2
(45) Date of Patent: *May 24, 2016

(54) SYSTEMS AND METHODS FOR SYNCHRONIZING OPERATIONS AMONG A PLURALITY OF INDEPENDENTLY CLOCKED DIGITAL DATA PROCESSING DEVICES WITHOUT A VOLTAGE CONTROLLED CRYSTAL OSCILLATOR

(71) Applicant: Sonos Inc, Santa Barbara, CA (US)

(72) Inventors: Nicholas A. J. Millington, Santa Barbara, CA (US); Michael Ericson, Santa Barbara, CA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/564,544

(22) Filed: Dec. 9, 2014

(65) Prior Publication Data

US 2015/0095689 A1 Apr. 2, 2015

Related U.S. Application Data

(63) Continuation of application No. 14/176,808, filed on Feb. 10, 2014, now Pat. No. 8,938,637, which is a continuation of application No. 13/724,048, filed on Dec. 21, 2012, now Pat. No. 8,689,036, which is a (Continued)

(51) Int. Cl.
*G06F 1/00* (2006.01)
*H04J 3/06* (2006.01)
(Continued)

(52) U.S. Cl.
CPC *G06F 1/00* (2013.01); *G05B 15/02* (2013.01); *G06F 3/048* (2013.01); *G06F 3/0482* (2013.01);

(Continued)

(58) Field of Classification Search
CPC .......... G06F 1/00; G06F 3/048; G06F 3/0484
USPC .................................................. 713/300, 500
See application file for complete search history.

(56) References Cited

U.S. PATENT DOCUMENTS 4,296,278 A 10/1981 Cullison et al.
4,816,989 A 3/1989 Finn et al.
(Continued)

FOREIGN PATENT DOCUMENTS

EP 0251584 1/1988
EP 672985 9/1995
(Continued)

OTHER PUBLICATIONS

"Polycom Conference Composer manual: copyright 2001", 29 pages.
(Continued)

*Primary Examiner* — Vincent Tran
(74) *Attorney, Agent, or Firm* — McDonnell Boehnen Hulbert & Berghoff LLP (57) ABSTRACT

Example systems, apparatus, and methods receive audio information including a plurality of frames from a source device, wherein each frame of the plurality of frames includes one or more audio samples and a time stamp indicating when to play the one or more audio samples of the respective frame. In an example, the time stamp is updated for each of the plurality of frames using a time differential value determined between clock information received from the source device and clock information associated with the device. The updated time stamp is stored for each of the plurality of frames, and the audio information is output based on the plurality of frames and associated updated time stamps. A number of samples per frame to be output is adjusted based on a comparison between the updated time stamp for the frame and a predicted time value for play back of the frame.

20 Claims, 4 Drawing Sheets

Related U.S. Application Data continuation of application No. 13/204,511, filed on Aug. 5, 2011, now Pat. No. 8,370,678, which is a continuation of application No. 11/801,468, filed on May 9, 2007, now Pat. No. 8,020,023, which is a continuation-in-part of application No. 10/816,217, filed on Apr. 1, 2004, now Pat. No. 8,234,395.

(60) Provisional application No. 60/490,768, filed on Jul. 28, 2003.

(51) Int. Cl.

| | | |
|---|---|---|
| *H04R 27/00* | (2006.01) | |
| *G06F 17/00* | (2006.01) | |
| *H03G 3/20* | (2006.01) | |
| *H04L 29/06* | (2006.01) | |
| *G06F 3/048* | (2013.01) | |
| *G06F 3/16* | (2006.01) | |
| *H04L 29/08* | (2006.01) | |
| *G06F 3/0484* | (2013.01) | |
| *H04R 3/12* | (2006.01) | |
| *G06F 17/30* | (2006.01) | |
| *G06F 3/0482* | (2013.01) | |
| *H03G 3/00* | (2006.01) | |
| *H04H 20/10* | (2008.01) | |
| *H04H 20/26* | (2008.01) | |
| *G05B 15/02* | (2006.01) | |
| *G11B 20/10* | (2006.01) | |
| *H04N 5/04* | (2006.01) | |
| *H04N 9/79* | (2006.01) | |
| *H04N 21/43* | (2011.01) | |
| *H04N 21/436* | (2011.01) | |

(52) U.S. Cl.
CPC ............... *G06F 3/0484* (2013.01); *G06F 3/16* (2013.01); *G06F 3/165* (2013.01); *G06F 3/167* (2013.01); *G06F 17/00* (2013.01); *G06F 17/3074* (2013.01); *G11B 20/10527* (2013.01); *H03G 3/00* (2013.01); *H03G 3/20* (2013.01); *H04H 20/103* (2013.01); *H04H 20/26* (2013.01); *H04J 3/0664* (2013.01); *H04L 65/60* (2013.01); *H04L 65/80* (2013.01); *H04L 67/1095* (2013.01); *H04L 67/26* (2013.01); *H04L 69/28* (2013.01); *H04N 5/04* (2013.01); *H04N 9/7904* (2013.01); *H04N 21/4307* (2013.01); *H04N 21/43615* (2013.01); *H04R 3/12* (2013.01); *H04R 27/00* (2013.01); *G11B 2020/10592* (2013.01); *H04H 2201/20* (2013.01); *H04L 65/4076* (2013.01); *H04R 2227/003* (2013.01); *H04R 2227/005* (2013.01)

(56) References Cited

U.S. PATENT DOCUMENTS

| | | |
|---|---|---|
| 5,153,579 A | 10/1992 | Fisch et al. |
| 5,182,552 A | 1/1993 | Payntin |
| 5,239,458 A | 8/1993 | Susuki |
| 5,299,266 A | 3/1994 | Lumsden |
| 5,406,634 A | 4/1995 | Anderson et al. |
| 5,440,644 A | 8/1995 | Farinelli et al. |
| 5,467,342 A | 11/1995 | Logston et al. |
| 5,491,839 A | 2/1996 | Schotz |
| 5,553,222 A | 9/1996 | Milne et al. |
| 5,602,992 A | 2/1997 | Danneels |
| 5,668,884 A | 9/1997 | Clair, Jr. et al. |
| 5,673,323 A | 9/1997 | Schotz et al. |
| 5,696,896 A | 12/1997 | Badovinatz et al. |
| 5,726,989 A | 3/1998 | Dokic |
| 5,751,819 A | 5/1998 | Dorrough |
| 5,761,320 A | 6/1998 | Farinelli et al. |
| 5,787,249 A | 7/1998 | Badovinatz et al. |
| 5,808,662 A | 9/1998 | Kinney et al. |
| 5,815,689 A | 9/1998 | Shaw et al. |
| 5,867,691 A | 2/1999 | Shiraishi |
| 5,875,354 A | 2/1999 | Charlton et al. |
| 5,887,143 A | 3/1999 | Saito et al. |
| 5,923,869 A | 7/1999 | Kashiwagi et al. |
| 5,923,902 A | 7/1999 | Inagaki |
| 5,946,343 A | 8/1999 | Schotz et al. |
| 5,956,088 A | 9/1999 | Shen et al. |
| 6,009,457 A | 12/1999 | Moller |
| 6,026,150 A | 2/2000 | Frank et al. |
| 6,031,818 A | 2/2000 | Lo et al. |
| 6,108,485 A | 8/2000 | Kim |
| 6,108,686 A | 8/2000 | Williams, Jr. |
| 6,122,668 A | 9/2000 | Teng et al. |
| 6,128,318 A | 10/2000 | Sato |
| 6,157,957 A | 12/2000 | Berthaud |
| 6,175,872 B1 | 1/2001 | Neumann et al. |
| 6,185,737 B1 | 2/2001 | Northcutt et al. |
| 6,195,436 B1 | 2/2001 | Scibora et al. |
| 6,199,169 B1 | 3/2001 | Voth |
| 6,255,961 B1 | 7/2001 | Van et al. |
| 6,256,554 B1 | 7/2001 | Dilorenzo |
| 6,308,207 B1 | 10/2001 | Tseng et al. |
| 6,324,586 B1 | 11/2001 | Johnson |
| 6,332,147 B1 | 12/2001 | Moran et al. |
| 6,343,028 B1 | 1/2002 | Kuwaoka |
| 6,349,339 B1 | 2/2002 | Williams |
| 6,351,821 B1 | 2/2002 | Voth |
| 6,404,811 B1 | 6/2002 | Cvetko et al. |
| 6,430,353 B1 | 8/2002 | Honda et al. |
| 6,449,653 B2 | 9/2002 | Klemets et al. |
| 6,487,296 B1 | 11/2002 | Allen et al. |
| 6,522,886 B1 | 2/2003 | Youngs et al. |
| 6,526,325 B1 | 2/2003 | Sussman et al. |
| 6,535,121 B2 | 3/2003 | Matheny |
| 6,587,127 B1 | 7/2003 | Leeke et al. |
| 6,598,172 B1 | 7/2003 | Vandeusen et al. |
| 6,611,537 B1 | 8/2003 | Edens et al. |
| 6,631,410 B1 | 10/2003 | Kowalski et al. |
| 6,674,803 B1 | 1/2004 | Kesselring |
| 6,687,664 B1 | 2/2004 | Sussman et al. |
| 6,757,517 B2 | 6/2004 | Chang |
| 6,778,493 B1 | 8/2004 | Ishii |
| 6,778,869 B2 | 8/2004 | Champion |
| 6,816,818 B2 | 11/2004 | Wolf et al. |
| 6,823,225 B1 | 11/2004 | Sass |
| 6,826,283 B1 | 11/2004 | Wheeler et al. |
| 6,836,788 B2 | 12/2004 | Kim et al. |
| 6,839,752 B1 | 1/2005 | Miller et al. |
| 6,898,642 B2 | 5/2005 | Chafle et al. |
| 6,907,458 B2 | 6/2005 | Tomassetti et al. |
| 6,912,610 B2 | 6/2005 | Spencer |
| 6,920,373 B2 | 7/2005 | Xi et al. |
| 6,934,766 B1 | 8/2005 | Russell |
| 6,970,482 B2 | 11/2005 | Kim |
| 6,985,694 B1 | 1/2006 | De Bonet et al. |
| 7,007,106 B1 | 2/2006 | Flood et al. |
| 7,020,791 B1 | 3/2006 | Aweya et al. |
| 7,043,651 B2 | 5/2006 | Aweya et al. |
| 7,047,308 B2 | 5/2006 | Deshpande |
| 7,068,596 B1 | 6/2006 | Mou |
| 7,113,999 B2 | 9/2006 | Pestoni et al. |
| 7,115,017 B1 | 10/2006 | Laursen et al. |
| 7,130,368 B1 | 10/2006 | Aweya et al. |
| 7,130,608 B2 | 10/2006 | Hollstrom et al. |
| 7,130,616 B2 | 10/2006 | Janik |
| 7,136,934 B2 | 11/2006 | Carter et al. |
| 7,143,141 B1 | 11/2006 | Morgan et al. |
| 7,143,939 B2 | 12/2006 | Henzerling |
| 7,158,488 B2 | 1/2007 | Fujimori |
| 7,162,315 B2 | 1/2007 | Gilbert |
| 7,185,090 B2 | 2/2007 | Kowalski et al. |
| 7,187,947 B1 | 3/2007 | White et al. |
| 7,206,367 B1 | 4/2007 | Moore |
| 7,206,967 B1 | 4/2007 | Marti et al. |

(56) References Cited

U.S. PATENT DOCUMENTS

| | | |
|---|---|---|
| 7,209,795 B2 | 4/2007 | Sullivan et al. |
| 7,218,708 B2 | 5/2007 | Berezowski et al. |
| 7,236,739 B2 | 6/2007 | Chang |
| 7,236,773 B2 | 6/2007 | Thomas |
| 7,293,060 B2 | 11/2007 | Komzi |
| 7,312,785 B2 | 12/2007 | Tsuk et al. |
| 7,313,593 B1 | 12/2007 | Pulito et al. |
| 7,319,764 B1 | 1/2008 | Reid et al. |
| 7,324,857 B2 | 1/2008 | Goddard |
| 7,333,519 B2 | 2/2008 | Sullivan et al. |
| 7,372,846 B2 | 5/2008 | Zwack |
| 7,392,102 B2 | 6/2008 | Sullivan et al. |
| 7,412,499 B2 | 8/2008 | Chang et al. |
| 7,474,677 B2 | 1/2009 | Trott |
| 7,483,538 B2 | 1/2009 | McCarty et al. |
| 7,483,540 B2 | 1/2009 | Rabinowitz et al. |
| 7,483,958 B1 | 1/2009 | Elabbady et al. |
| 7,509,181 B2 | 3/2009 | Champion |
| 7,519,667 B1 | 4/2009 | Capps |
| 7,571,014 B1 | 8/2009 | Lambourne et al. |
| 7,574,274 B2 | 8/2009 | Holmes |
| 7,599,685 B2 | 10/2009 | Goldberg et al. |
| 7,606,174 B2 | 10/2009 | Ochi et al. |
| 7,631,119 B2 | 12/2009 | Moore et al. |
| 7,643,894 B2 | 1/2010 | Braithwaite et al. |
| 7,657,224 B2 | 2/2010 | Goldberg et al. |
| 7,657,644 B1 | 2/2010 | Zheng |
| 7,657,910 B1 | 2/2010 | McAulay et al. |
| 7,668,990 B2 | 2/2010 | Kriyzanowski et al. |
| 7,669,113 B1 | 2/2010 | Moore et al. |
| 7,669,219 B2 | 2/2010 | Scott |
| 7,672,470 B2 | 3/2010 | Lee |
| 7,675,943 B2 | 3/2010 | Mosig et al. |
| 7,676,142 B1 | 3/2010 | Hung |
| 7,689,304 B2 | 3/2010 | Sasaki |
| 7,689,305 B2 | 3/2010 | Kreifeldt et al. |
| 7,702,279 B2 | 4/2010 | Ko et al. |
| 7,702,403 B1 | 4/2010 | Gladwin et al. |
| 7,711,774 B1 | 5/2010 | Rothschild |
| 7,720,096 B2 | 5/2010 | Klemets |
| 7,742,740 B2 | 6/2010 | Goldberg et al. |
| 7,743,009 B2 | 6/2010 | Hangartner et al. |
| 7,765,315 B2 | 7/2010 | Batson et al. |
| RE41,608 E | 8/2010 | Blair et al. |
| 7,827,259 B2 | 11/2010 | Heller et al. |
| 7,835,689 B2 | 11/2010 | Goldberg et al. |
| 7,853,341 B2 | 12/2010 | McCarty et al. |
| 7,865,137 B2 | 1/2011 | Goldberg et al. |
| 7,885,622 B2 | 2/2011 | Kram et al. |
| 7,916,877 B2 | 3/2011 | Goldberg et al. |
| 7,917,082 B2 | 3/2011 | Goldberg et al. |
| 7,934,239 B1 | 4/2011 | Dag man |
| 7,958,441 B2 | 6/2011 | Heller et al. |
| 7,996,588 B2 | 8/2011 | Subbiah et al. |
| 8,014,423 B2 | 9/2011 | Thaler et al. |
| 8,015,306 B2 | 9/2011 | Bowman |
| 8,020,023 B2 | 9/2011 | Millington et al. |
| 8,023,663 B2 | 9/2011 | Goldberg |
| 8,028,038 B2 | 9/2011 | Weel |
| 8,028,323 B2 | 9/2011 | Weel |
| 8,045,721 B2 | 10/2011 | Burgan et al. |
| 8,045,952 B2 | 10/2011 | Qureshey et al. |
| 8,050,652 B2 | 11/2011 | Qureshey et al. |
| 8,055,364 B2 | 11/2011 | Champion |
| 8,074,253 B1 | 12/2011 | Nathan |
| 8,086,752 B2 | 12/2011 | Millington et al. |
| 8,090,317 B2 | 1/2012 | Burge et al. |
| 8,103,009 B2 | 1/2012 | McCarty et al. |
| 8,111,132 B2 | 2/2012 | Allen et al. |
| 8,112,032 B2 | 2/2012 | Ko et al. |
| 8,116,476 B2 | 2/2012 | Inohara |
| 8,126,172 B2 | 2/2012 | Horbach et al. |
| 8,131,390 B2 | 3/2012 | Braithwaite et al. |
| 8,144,883 B2 | 3/2012 | Pdersen et al. |
| 8,148,622 B2 | 4/2012 | Rothkopf et al. |
| 8,169,938 B2 | 5/2012 | Duchscher et al. |
| 8,170,260 B2 | 5/2012 | Reining et al. |
| 8,175,297 B1 | 5/2012 | Ho et al. |
| 8,185,674 B2 | 5/2012 | Moore et al. |
| 8,194,874 B2 | 6/2012 | Starobin et al. |
| 8,208,653 B2 | 6/2012 | Eo et al. |
| 8,214,447 B2 | 7/2012 | Deslippe et al. |
| 8,214,740 B2 | 7/2012 | Johnson |
| 8,214,873 B2 | 7/2012 | Weel |
| 8,218,790 B2 | 7/2012 | Bull et al. |
| 8,230,099 B2 | 7/2012 | Weel |
| 8,233,648 B2 | 7/2012 | Sorek et al. |
| 8,234,395 B2 | 7/2012 | Millington |
| 8,239,748 B1 | 8/2012 | Moore et al. |
| 8,279,709 B2 | 10/2012 | Choisel et al. |
| 8,281,001 B2 | 10/2012 | Busam et al. |
| 8,290,603 B1 | 10/2012 | Lambourne |
| 8,300,845 B2 | 10/2012 | Zurek et al. |
| 8,315,555 B2 | 11/2012 | Ko et al. |
| 8,316,147 B2 | 11/2012 | Batson et al. |
| 8,325,931 B2 | 12/2012 | Howard et al. |
| 8,340,330 B2 | 12/2012 | Yoon et al. |
| 8,345,709 B2 | 1/2013 | Nitzpon et al. |
| 8,364,295 B2 | 1/2013 | Beckmann et al. |
| 8,370,678 B2 | 2/2013 | Millington et al. |
| 8,407,623 B2 | 3/2013 | Kerr et al. |
| 8,423,659 B2 | 4/2013 | Millington |
| 8,423,893 B2 | 4/2013 | Ramsay et al. |
| 8,432,851 B2 | 4/2013 | Xu et al. |
| 8,433,076 B2 | 4/2013 | Zurek et al. |
| 8,457,334 B2 | 6/2013 | Yoon et al. |
| 8,463,184 B2 | 6/2013 | Dua |
| 8,463,875 B2 | 6/2013 | Katz et al. |
| 8,473,844 B2 | 6/2013 | Kreifeldt et al. |
| 8,509,211 B2 | 8/2013 | Trotter et al. |
| 8,520,870 B2 | 8/2013 | Sato et al. |
| 8,577,048 B2 | 11/2013 | Chaikin et al. |
| 8,588,949 B2 | 11/2013 | Lambourne et al. |
| 8,611,559 B2 | 12/2013 | Sanders |
| 8,615,091 B2 | 12/2013 | Terwal |
| 8,639,830 B2 | 1/2014 | Bowman |
| 8,683,009 B2 | 3/2014 | Ng et al. |
| 8,731,206 B1 | 5/2014 | Park |
| 8,750,282 B2 | 6/2014 | Gelter et al. |
| 8,751,026 B2 | 6/2014 | Sato et al. |
| 8,762,565 B2 | 6/2014 | Togashi et al. |
| 8,775,546 B2 | 7/2014 | Millington |
| 8,818,538 B2 | 8/2014 | Sakata |
| 8,819,554 B2 | 8/2014 | Basso et al. |
| 8,843,586 B2 | 9/2014 | Pantos et al. |
| 8,885,851 B2 | 11/2014 | Westenbroek |
| 8,904,066 B2 | 12/2014 | Moore et al. |
| 8,917,877 B2 | 12/2014 | Haaff et al. |
| 8,930,006 B2 | 1/2015 | Haatainen |
| 8,954,177 B2 | 2/2015 | Sanders |
| 8,965,544 B2 | 2/2015 | Ramsay |
| 8,966,394 B2 | 2/2015 | Gates et al. |
| 9,042,556 B2 | 5/2015 | Kallai et al. |
| 9,137,602 B2 | 9/2015 | Mayman et al. |
| 2001/0009604 A1 | 7/2001 | Ando et al. |
| 2001/0022823 A1 | 9/2001 | Renaud |
| 2001/0027498 A1 | 10/2001 | Van De Meulenhof et al. |
| 2001/0032188 A1 | 10/2001 | Miyabe et al. |
| 2001/0042107 A1 | 11/2001 | Palm |
| 2001/0046235 A1 | 11/2001 | Trevitt et al. |
| 2001/0047377 A1 | 11/2001 | Sincaglia et al. |
| 2002/0002039 A1 | 1/2002 | Qureshey et al. |
| 2002/0002562 A1 | 1/2002 | Moran et al. |
| 2002/0002565 A1 | 1/2002 | Ohyama |
| 2002/0003548 A1 | 1/2002 | Krusche et al. |
| 2002/0022453 A1 | 2/2002 | Balog et al. |
| 2002/0026442 A1 | 2/2002 | Lipscomb et al. |
| 2002/0034374 A1 | 3/2002 | Barton |
| 2002/0042844 A1 | 4/2002 | Chiazzese |
| 2002/0049843 A1 | 4/2002 | Barone, Jr. et al. |
| 2002/0062406 A1 | 5/2002 | Chang et al. |
| 2002/0065926 A1 | 5/2002 | Hackney et al. |
| 2002/0072816 A1 | 6/2002 | Shdema et al. |
| 2002/0073228 A1 | 6/2002 | Cognet et al. |

(56) References Cited

U.S. PATENT DOCUMENTS

| | | |
|---|---|---|
| 2002/0080783 A1 | 6/2002 | Fujimori |
| 2002/0090914 A1 | 7/2002 | Kang et al. |
| 2002/0093478 A1 | 7/2002 | Yeh |
| 2002/0095460 A1 | 7/2002 | Benson |
| 2002/0109710 A1 | 8/2002 | Holtz et al. |
| 2002/0112244 A1 | 8/2002 | Liou et al. |
| 2002/0114354 A1 | 8/2002 | Sinha et al. |
| 2002/0114359 A1 | 8/2002 | Ibaraki et al. |
| 2002/0124097 A1 | 9/2002 | Isely et al. |
| 2002/0129156 A1 | 9/2002 | Yoshikawa |
| 2002/0143998 A1 | 10/2002 | Rajagopal et al. |
| 2002/0159596 A1 | 10/2002 | Durand et al. |
| 2002/0163361 A1 | 11/2002 | Parkin |
| 2002/0165721 A1 | 11/2002 | Chang et al. |
| 2002/0165921 A1 | 11/2002 | Sapieyevski |
| 2002/0168938 A1 | 11/2002 | Chang |
| 2002/0173273 A1 | 11/2002 | Spurgat et al. |
| 2002/0177411 A1 | 11/2002 | Yajima et al. |
| 2002/0184310 A1 | 12/2002 | Travesat et al. |
| 2002/0188762 A1 | 12/2002 | Tomassetti et al. |
| 2002/0194309 A1 | 12/2002 | Carter et al. |
| 2003/0002609 A1 | 1/2003 | Faller et al. |
| 2003/0018797 A1 | 1/2003 | Dunning et al. |
| 2003/0020763 A1 | 1/2003 | Mayer et al. |
| 2003/0023741 A1 | 1/2003 | Tomassetti et al. |
| 2003/0035072 A1 | 2/2003 | Hagg |
| 2003/0035444 A1 | 2/2003 | Zwack |
| 2003/0041173 A1 | 2/2003 | Hoyle |
| 2003/0041174 A1 | 2/2003 | Wen et al. |
| 2003/0043924 A1 | 3/2003 | Haddad et al. |
| 2003/0055892 A1 | 3/2003 | Huitema et al. |
| 2003/0061428 A1 | 3/2003 | Garney et al. |
| 2003/0066094 A1 | 4/2003 | Van der Schaar et al. |
| 2003/0067437 A1 | 4/2003 | McClintock et al. |
| 2003/0073432 A1 | 4/2003 | Meade |
| 2003/0099212 A1 | 5/2003 | Anjum et al. |
| 2003/0099221 A1 | 5/2003 | Rhee |
| 2003/0101253 A1 | 5/2003 | Saito et al. |
| 2003/0110329 A1 | 6/2003 | Higaki et al. |
| 2003/0126211 A1 | 7/2003 | Anttila et al. |
| 2003/0157951 A1 | 8/2003 | Hasty |
| 2003/0195964 A1 | 10/2003 | Mane |
| 2003/0198254 A1 | 10/2003 | Sullivan et al. |
| 2003/0198255 A1 | 10/2003 | Sullivan et al. |
| 2003/0198257 A1 | 10/2003 | Sullivan et al. |
| 2003/0200001 A1 | 10/2003 | Goddard |
| 2003/0204273 A1 | 10/2003 | Dinker et al. |
| 2003/0204509 A1 | 10/2003 | Dinker et al. |
| 2003/0210796 A1 | 11/2003 | McCarty et al. |
| 2003/0219007 A1 | 11/2003 | Barrack et al. |
| 2003/0227478 A1 | 12/2003 | Chatfield |
| 2003/0231871 A1 | 12/2003 | Ushimaru |
| 2003/0235304 A1 | 12/2003 | Evans et al. |
| 2004/0001484 A1 | 1/2004 | Ozguner |
| 2004/0001591 A1 | 1/2004 | Mani et al. |
| 2004/0008852 A1 | 1/2004 | Also et al. |
| 2004/0010727 A1 | 1/2004 | Fujinami |
| 2004/0012620 A1 | 1/2004 | Buhler et al. |
| 2004/0015252 A1 | 1/2004 | Also et al. |
| 2004/0019497 A1 | 1/2004 | Volk et al. |
| 2004/0024478 A1 | 2/2004 | Hans et al. |
| 2004/0024925 A1 | 2/2004 | Cypher et al. |
| 2004/0027166 A1 | 2/2004 | Mangum et al. |
| 2004/0032348 A1 | 2/2004 | Lai et al. |
| 2004/0041836 A1 | 3/2004 | Zaner et al. |
| 2004/0048569 A1 | 3/2004 | Kawamura |
| 2004/0066736 A1 | 4/2004 | Kroeger |
| 2004/0075767 A1 | 4/2004 | Neuman et al. |
| 2004/0078383 A1 | 4/2004 | Mercer et al. |
| 2004/0080671 A1 | 4/2004 | Siemens et al. |
| 2004/0093096 A1 | 5/2004 | Huang et al. |
| 2004/0098754 A1 | 5/2004 | Vella et al. |
| 2004/0131192 A1 | 7/2004 | Metcalf |
| 2004/0133689 A1 | 7/2004 | Vasisht |
| 2004/0143368 A1 | 7/2004 | May et al. |
| 2004/0143852 A1 | 7/2004 | Meyers |
| 2004/0148237 A1 | 7/2004 | Bittmann et al. |
| 2004/0170383 A1 | 9/2004 | Mazur |
| 2004/0203378 A1 | 10/2004 | Powers |
| 2004/0208158 A1 | 10/2004 | Fellman et al. |
| 2004/0213230 A1 | 10/2004 | Douskalis et al. |
| 2004/0224638 A1 | 11/2004 | Fadell et al. |
| 2004/0228367 A1 | 11/2004 | Mosig |
| 2004/0248601 A1 | 12/2004 | Chang |
| 2004/0249965 A1 | 12/2004 | Huggins et al. |
| 2004/0249982 A1 | 12/2004 | Arnold et al. |
| 2004/0252400 A1 | 12/2004 | Blank et al. |
| 2005/0010691 A1 | 1/2005 | Oyadomari et al. |
| 2005/0011388 A1 | 1/2005 | Kouznetsov |
| 2005/0013394 A1 | 1/2005 | Rausch et al. |
| 2005/0015551 A1 | 1/2005 | Eames et al. |
| 2005/0021590 A1 | 1/2005 | Debique et al. |
| 2005/0027821 A1 | 2/2005 | Alexander et al. |
| 2005/0047605 A1 | 3/2005 | Lee et al. |
| 2005/0058149 A1 | 3/2005 | Howe |
| 2005/0062637 A1 | 3/2005 | El Zabadani et al. |
| 2005/0081213 A1 | 4/2005 | Suzuoki et al. |
| 2005/0114538 A1 | 5/2005 | Rose |
| 2005/0120128 A1 | 6/2005 | Willes et al. |
| 2005/0125357 A1 | 6/2005 | Saadat et al. |
| 2005/0131558 A1 | 6/2005 | Braithwaite et al. |
| 2005/0166135 A1 | 7/2005 | Burke et al. |
| 2005/0168630 A1 | 8/2005 | Yamada et al. |
| 2005/0177643 A1 | 8/2005 | Xu |
| 2005/0181348 A1 | 8/2005 | Carey et al. |
| 2005/0195205 A1 | 9/2005 | Abrams, Jr. |
| 2005/0195823 A1 | 9/2005 | Chen et al. |
| 2005/0216556 A1 | 9/2005 | Manion et al. |
| 2005/0281255 A1 | 12/2005 | Davies et al. |
| 2005/0283820 A1 | 12/2005 | Richards et al. |
| 2005/0288805 A1 | 12/2005 | Moore et al. |
| 2005/0289224 A1 | 12/2005 | Deslippe et al. |
| 2006/0095516 A1 | 5/2006 | Wijeratne |
| 2006/0098936 A1 | 5/2006 | Ikeda et al. |
| 2006/0119497 A1 | 6/2006 | Miller et al. |
| 2006/0143236 A1 | 6/2006 | Wu |
| 2006/0193454 A1 | 8/2006 | Abou-chakra et al. |
| 2007/0038999 A1 | 2/2007 | Millington |
| 2007/0043847 A1 | 2/2007 | Carter et al. |
| 2007/0047712 A1 | 3/2007 | Gross et al. |
| 2007/0048713 A1 | 3/2007 | Plastina et al. |
| 2007/0054680 A1 | 3/2007 | Mo et al. |
| 2007/0142022 A1 | 6/2007 | Madonna et al. |
| 2007/0142944 A1 | 6/2007 | Goldberg et al. |
| 2007/0143493 A1 | 6/2007 | Mullig et al. |
| 2007/0169115 A1 | 7/2007 | Ko et al. |
| 2007/0180137 A1 | 8/2007 | Rajapakse |
| 2007/0192156 A1 | 8/2007 | Gauger |
| 2007/0249295 A1 | 10/2007 | Ukita et al. |
| 2007/0271388 A1 | 11/2007 | Bowra et al. |
| 2007/0299778 A1 | 12/2007 | Haveson et al. |
| 2008/0022320 A1 | 1/2008 | Ver Steeg |
| 2008/0025535 A1 | 1/2008 | Rajapakse |
| 2008/0091771 A1 | 4/2008 | Allen et al. |
| 2008/0120429 A1 | 5/2008 | Millington et al. |
| 2008/0126943 A1 | 5/2008 | Parasnis et al. |
| 2008/0144861 A1 | 6/2008 | Melanson et al. |
| 2008/0212786 A1 | 9/2008 | Park |
| 2008/0215169 A1 | 9/2008 | DeBettencourt et al. |
| 2009/0017868 A1 | 1/2009 | Ueda et al. |
| 2009/0031336 A1 | 1/2009 | Chavez et al. |
| 2009/0100189 A1 | 4/2009 | Bahren et al. |
| 2009/0157905 A1 | 6/2009 | Davis |
| 2009/0193345 A1 | 7/2009 | Wensley et al. |
| 2009/0222115 A1 | 9/2009 | Malcolm et al. |
| 2009/0228919 A1 | 9/2009 | Zott et al. |
| 2009/0251604 A1 | 10/2009 | Iyer |
| 2010/0004983 A1 | 1/2010 | Dickerson et al. |
| 2010/0049835 A1 | 2/2010 | Ko et al. |
| 2010/0228740 A1 | 9/2010 | Cannistraro et al. |
| 2010/0284389 A1 | 11/2010 | Ramsay et al. |
| 2010/0299639 A1 | 11/2010 | Ramsay et al. |
| 2011/0066943 A1 | 3/2011 | Brillon et al. |
| 2011/0228944 A1 | 9/2011 | Croghan et al. |

(56) References Cited

U.S. PATENT DOCUMENTS

| | | | |
|---|---|---|---|
| 2012/0029671 A1 | 2/2012 | Millington et al. |
| 2012/0030366 A1 | 2/2012 | Collart et al. |
| 2012/0060046 A1 | 3/2012 | Millington |
| 2012/0129446 A1 | 5/2012 | Ko et al. |
| 2012/0148075 A1 | 6/2012 | Goh et al. |
| 2012/0237054 A1 | 9/2012 | Eo et al. |
| 2012/0290621 A1 | 11/2012 | Heitz et al. |
| 2013/0018960 A1 | 1/2013 | Knysz et al. |
| 2013/0038726 A1 | 2/2013 | Kim |
| 2013/0047084 A1 | 2/2013 | Sanders et al. |
| 2013/0080599 A1 | 3/2013 | Ko et al. |
| 2013/0167029 A1 | 6/2013 | Friesen et al. |
| 2013/0174100 A1 | 7/2013 | Seymour et al. |
| 2013/0191454 A1 | 7/2013 | Oliver et al. |
| 2013/0197682 A1 | 8/2013 | Millington |
| 2013/0230175 A1 | 9/2013 | Bech et al. |
| 2013/0279706 A1 | 10/2013 | Marti |
| 2014/0006483 A1 | 1/2014 | Garmark et al. |
| 2014/0037097 A1 | 2/2014 | Labosco |
| 2014/0064501 A1 | 3/2014 | Olsen et al. |
| 2014/0075308 A1 | 3/2014 | Sanders et al. |
| 2014/0075311 A1 | 3/2014 | Boettcher et al. |
| 2014/0079242 A1 | 3/2014 | Nguyen et al. |
| 2014/0108929 A1 | 4/2014 | Garmark et al. |
| 2014/0123005 A1 | 5/2014 | Forstall et al. |
| 2014/0140530 A1 | 5/2014 | Gomes-Casseres et al. |
| 2014/0161265 A1 | 6/2014 | Chaikin et al. |
| 2014/0181569 A1 | 6/2014 | Millington et al. |
| 2014/0242913 A1 | 8/2014 | Pang |
| 2014/0256260 A1 | 9/2014 | Ueda et al. |
| 2014/0267148 A1 | 9/2014 | Luna et al. |
| 2014/0270202 A1 | 9/2014 | Ivanov et al. |
| 2014/0273859 A1 | 9/2014 | Luna et al. |
| 2014/0279889 A1 | 9/2014 | Luna |
| 2014/0285313 A1 | 9/2014 | Luna et al. |
| 2014/0286496 A1 | 9/2014 | Luna et al. |
| 2014/0323036 A1 | 10/2014 | Daley et al. |
| 2014/0344689 A1 | 11/2014 | Scott et al. |
| 2014/0378056 A1 | 12/2014 | Liu |
| 2015/0026613 A1 | 1/2015 | Kwon et al. |
| 2015/0032844 A1 | 1/2015 | Tarr et al. |
| 2015/0043736 A1 | 2/2015 | Olsen et al. |
| 2015/0049248 A1 | 2/2015 | Wang et al. |
| 2015/0074527 A1 | 3/2015 | Sevigny et al. |
| 2015/0074528 A1 | 3/2015 | Sakalowsky et al. |
| 2015/0098576 A1 | 4/2015 | Sundaresan et al. |
| 2015/0256954 A1 | 9/2015 | Carlsson et al. |

FOREIGN PATENT DOCUMENTS

| | | | |
|---|---|---|---|
| EP | 0772374 A2 | 5/1997 |
| EP | 1111527 | 6/2001 |
| EP | 1122931 | 8/2001 |
| EP | 2713281 | 4/2004 |
| EP | 2043381 A2 | 4/2009 |
| EP | 2161950 A2 | 3/2010 |
| EP | 2591617 B1 | 6/2014 |
| GB | 2284327 | 5/1995 |
| GB | 2338374 | 12/1999 |
| GB | 2486183 | 6/2012 |
| JP | 07-210129 | 8/1995 |
| JP | 2003037585 | 2/2003 |
| JP | 2003506765 A | 2/2003 |
| JP | 2003101958 | 4/2003 |
| JP | 2003169089 A | 6/2003 |
| JP | 2005108427 | 4/2005 |
| WO | 9525313 | 9/1995 |
| WO | 9961985 | 12/1999 |
| WO | 0110125 A1 | 2/2001 |
| WO | 0153994 | 7/2001 |
| WO | 02073851 | 9/2002 |
| WO | 03093950 | 11/2003 |
| WO | 2005013047 | 2/2005 |
| WO | 2014149533 A2 | 9/2014 |

OTHER PUBLICATIONS

"UPnP; "Universal Plug and Play Device Architecture"; Jun. 8, 2000; version 1.0; Microsoft Corporation; pp. 1-54".

Akyildiz I.F., et al., "Multimedia Group Synchronization Protocols for Integrated Services Networks," IEEE Journal on Ig] Selected Areas in Communications, 1996, pp. 162-173, vol. 14 ( 1 ).

The United States Patent and Trademark Office, "Non-Final Office action", issued in connection with U.S. Appl. No. 14/178,808, mailed on Jun. 17, 2014, 7 pages.

Benslimane A., "A Multimedia Synchronization Protocol for Multicast Groups," Proceedings of the 26th Euromicro Ig] Conference, 2000, pp. 456-463,vol. 1.

Biersack E., et al., "Intra- and Inter-Stream Synchronisation for Stored Multimedia Streams," IEEE International Ig] Conference on Multimedia Computing and Systems, 1996, pp. 1-10.

Blakowski G_ et al., "A Media Synchronization Survey: Reference Model, Specification, and Case Studies", Jan. 1996, vol. 14, No. 1, 5-35.

Bretl W.E., et al., MPEG2 Tutorial [online], 2000 [retrieved on Jan. 13, 2009] Retrieved from the Internet:< http://www. Ig] bretl.com/mpeghtml/MPEGindex.htm>, pp. 1-23.

European Patent Office "Search Report", issued in connection with European patent Application No. 13184747.7 mailed on Feb. 28, 2014, 8 pages.

Huang C.M., et al., "A Synchronization Infrastructure for Multicast Multimedia at the Presentation Layer," IEEE Ig] Transactions on Consumer Electronics, 1997, pp. 370-380, vol. 43 (3).

International Bureau, "Written Opinion", issued in connection with PCT Application No. PCT/US2013/046386, on Sep. 30, 2013, 6 pages.

International Bureau,"Search Report" issued in connection with International Patent application No. PCT/ U52013/046372, mailed on Aug. 26, 2013, 3 pages.

International Bureau,"Search Report", issued in connection with PCT Application No. PCT/US2013/046386, on Sep. 30, 2013, 3 pages.

International Bureau,"Written opinion" issued in connection with International Patent application No. PCT/ U52013/046372, mailed on Aug. 26, 2013, 4 pages.

International Bureau, "Search Report", issued in connection with International Application No. PCT/US04/23102, mailed on Aug. 1, 2008, 7 pages.

Ishibashi Y., "A Group Synchronization Mechanism for Live Media in Multicast Communications," IEEE Global Ig] Telecommunications Conference, 1997, pp. 746-752, vol. 2.

Ishibashi Y., "A Group Synchronization Mechanism for Stored Media in Multicast Communications," IEEE Ig] Information Revolution and Communications, 1997, pp. 692-700, vol. 2.

Japanese Intellectual Property Office, "Decision of Rejection," issued in connection with Japanese patent application No. 2012-178711, mailed on Jul. 8, 2014, 3 pages.

Japanese Intellectual Property Office, "Office Action Summary," issued in connection with Japanese patent application No. 2012-178711, mailed on Nov. 19, 2013, 5 pages.

Jo et al,"Synchronized One-to-Many Media Streaming with Adaptive Playout Control," in: Proceedings of SPIE, vol. 4861, Edited by Tescher et al., Dec. 2001, pp. 71-82.

M. Nilsson., "ID3 Tag Version 2", Mar. 26, 1998, 28 pages.

Maniactools, Identify Duplicate Files by Sound,"Sep. 28, 2010, http://www.maniactools.com/soft/music-duplicate-remover/identify-duplicate-files-by-sound.shtml," 2 pages.

Mills D.L., "Network Time Protocol (Version 3) Specification, Implementation and Analysis," Network Working Group, Ig] Mar. 1992, <http://www.ietf.org/rfc/rfc1305.txt>.

Mills D.L., "Precision Synchronization of Computer Network Clocks," ACM SIGCOMM Computer Communication Ig] Review, 1994, pp. 1-16, vol. 24 (2).

Motorola., "Simplefi, Wireless Digital Audio Receiver, Installation and User Guide", Dec. 31, 2001.

Parks., et al., "Group Synchronization in Multicast Media Communications," Proceedings of the 5th Research on [g] Multicast Technology Workshop, 2003.

(56) References Cited

OTHER PUBLICATIONS

PRISM IQ; Inc., "PRISM IQ Media Player User Guide", 2003, 44 pages.

Rothermel K., et al., "An Adaptive Stream Synchronization Protocol," 5th International Workshop on Network and [g] Operating System Support for Digital Audio and Video, 1995, 22 pages.

Schulzrinne H., et al., "RTP: A Transport Protocol for Real-Time Applications, RFC 3550," Network Working [g] Group, 2003, pp. 1-89.

The MPEG-2 Transport Stream. Retrieved from the Internet< URL: http://www.coolstf.com/mpeg/#ts>., last visited [g] Mar. 3, 2013, pp. 1-5.

The United Patent and Trademark Office, "Final Office Action", issued in connection with U.S. Appl. No. 13/298,090, mailed on Jul. 3, 2012, 46 pages.

The United Patent and Trademark Office,"Final Office Action", issued in connection with U.S. Appl. No. 11/906,702, mailed on Jan. 21, 2010, 27 pages.

The United Patent and Trademark Office,"Non-Final Office Action", issued in connection with U.S. Appl. No. 13/827,653 mailed on Dec. 5, 2013, 28 pages.

The United Patent and Trademark Office,"Non-Final Office action", issued in connection with U.S. Appl. No. 11/906,702, mailed on Aug. 20, 2009, 27 pages.

The United Patent and Trademark Office,"Notice of Allowance", issued in connection with U.S. Appl. No. 13/298,090, mailed Jan. 31, 2013, 39 pages.

The United Patent and Trademark Office,"Notice of Allowance", issued in connection with U.S. Appl. No. 11/906,702 mailed on Nov. 10, 2011, 17 pages.

The United Patent and Trademark Office,"Notice of Allowance", issued in connection with U.S. Appl. No. 13/827,653, mailed on Mar. 6, 2014, 17 pages.

The United States Patent and Trademark Office, "Final Office Action", issued in connection with U.S. Appl. No. 13/533,105, mailed Mar. 27, 2014, 29 pages.

The United States Patent and Trademark Office, "Final Office Action", issued in connection with U.S. Appl. No. 13/907,666, mailed on Jun. 5, 2014, 12 pages.

The United States Patent and Trademark Office, "Non-Final Office Action", issued in connection with U.S. Appl. No. 13/298,090, mailed on Jan. 5, 2012, 40 pages.

The United States Patent and Trademark Office, "Non-Final Office Action", issued in connection with U.S. Appl. No. 13/907,666, mailed on Dec. 18, 2013, 12 pages.

The United States Patent and Trademark Office, "Non-Final Office Action", issued in connection with U.S. Appl. No. 14/186,850, mailed on May 27, 2014, 13 pages.

The United States Patent and Trademark Office,"Non-Final Office Action", issued in connection with U.S. Appl. No. 13/705,176, mailed May 6, 2014, 23 pages.

The United States Patent and Trademark Office,"Non-Final Office Action", issued in connection with U.S. Appl. No. 13/848,932, mailed May 14, 2014, 14 pages.

The United States Patent and Trademark Office,"Non-Final Office Action", issued in connection with U.S. Appl. No. 14/184,522, mailed May 1, 2014, 31 pages.

The United States Patent and Trademark Office,"Non-Final Office Action", issued in connection with U.S. Appl. No. 14/184,528, mailed May 12, 2014, 23 pages.

The United States Patent and Trademark Office, "Advisory Action", issued in connection with U.S. Appl. No. 10/816,217, mailed on Sep. 18, 2008, 8 pages.

The United States Patent and Trademark Office, "Final Office Action", issued in connection with U.S. Appl. No. 10/816,217, mailed on Jul. 13, 2009, 16 pages.

The United States Patent and Trademark Office, "Final Office Action", issued in connection with U.S. Appl. No. 10/816,217, mailed on Jun. 30, 2008, 30 pages.

The United States Patent and Trademark Office, "Final Office Action", issued in connection with U.S. Appl. No. 10/816,217, mailed on Oct. 21, 2011, 19 pages.

The United States Patent and Trademark Office, "Final Office Action", issued in connection with U.S. Appl. No. 10/816,217, mailed on Jan. 28, 2011, 21 pages.

The United States Patent and Trademark Office, "Non-Final Office Action", issued in connection with U.S. Appl. No. 10/816,217, mailed Jun. 25, 2010, 17 pages.

The United States Patent and Trademark Office, "Non-Final Office Action", issued in connection with U.S. Appl. No. 10/816,217, mailed on Jan. 18, 2008, 38 pages.

The United States Patent and Trademark Office, "Non-Final Office Action", issued in connection with U.S. Appl. No. 10/816,217, mailed on Jan. 22, 2009, 18 pages.

The United States Patent and Trademark Office, "Non-Final Office Action", issued in connection with U.S. Appl. No. 10/816,217, mailed on Jun. 21, 2011, 13 pages.

The United States Patent and Trademark Office, "Non-Final Office Action", issued in connection with U.S. Appl. No. 13/533,105, mailed on Nov. 25, 2013, 19 pages.

The United States Patent and Trademark Office, "Non-Final Office Action", issued in connection with U.S. Appl. No. 11/801,468, mailed on Nov. 29, 2010, 17 pages.

The United States Patent and Trademark Office, "Non-Final Office Action", issued in connection with U.S. Appl. No. 13/533,105, mailed on Jul. 31, 2014, 31 pages.

The United States Patent and Trademark Office, "Non-Final Office Action", issued in connection with U.S. Appl. No. 14/184,526, mailed on Jul. 25, 2014, 9 pages.

The United States Patent and Trademark Office, "Non-Final Office Action", issued in connection with U.S. Appl. No. 11/801,468, mailed on Apr. 19, 2010, 16 pages.

The United States Patent and Trademark Office, "Notice of Allowability", issued in connection with U.S. Appl. No. 13/619,237, mailed on Sep. 6, 2013, 4 pages.

The United States Patent and Trademark Office, "Notice of Allowance", issued in connection with U.S. Appl. No. 10/816,217, mailed on Dec. 27, 2011, 15 pages.

The United States Patent and Trademark Office, "Notice of Allowance", issued in connection with U.S. Appl. No. 11/801,468, mailed on May 6, 2011, 10 pages.

The United States Patent and Trademark Office,"Final Office Action", issued in connection with U.S. Appl. No. 13/297,000, mailed on Sep. 13, 2012, 17 pages.

The United States Patent and Trademark Office,"Non-final Office Action", issued in connection with U.S. Appl. No. 13/619,237, mailed on Apr. 10, 2013,10 pages.

The United States Patent and Trademark Office. "Non-Final Office action", issued in connection with U.S. Appl. No. 13/724,048, mailed on Mar. 19, 2013, 18 pages.

The United States Patent and Trademark Office. "Non-Final Office Action", issued in connection with U.S. Appl. No. 11/801,468, mailed on Apr. 19, 2010, 16 pages.

The United States Patent and Trademark Office. Non-Final Office action, issued in connection with U.S. Appl. No. 13/204,511, mailed on Apr. 30, 2012, 30 pages.

The United States Patent and Trademark Office. "Notice of Allowance", issued in connection with U.S. Appl. No. 13/204,511, mailed on Oct. 5, 2012, 11 pages.

The United States Patent and Trademark Office. "Notice of Allowance", issued in connection with U.S. Appl. No. 13/724,048, mailed on Nov. 13, 2013, 28 pages.

Voyetra Turtle Beach, Inc.,"AudioTron Setup Guide, Version 3.0", May 2002, 38 pages.

Voyetra; Turtle Beach Inc., "Audio Tron Quick Start Guide, Version 1.0", Mar. 2001, 24 pages.

Voyetra; Turtle Beach Inc., "Audio Tron Reference Manual, Version 3.0", May 2002, 70 pages.

Yamaha DME 32 manual: copyright 2001.

Yamaha DME Designer software manual: Copyright 2004, 482 pages.

(56) References Cited

OTHER PUBLICATIONS

The United States Patent and Trademark Office. "Non-Final Office action", issued in connection with U.S. Appl. No. 13/724,048, mailed on Jul. 30, 2013, 7 pages.
The United States Patent and Trademark Office, "Non-Final Office Action", issued in connection with U.S. Appl. No. 13/297,000, mailed Feb. 29, 2012, 10 pages.
The United States Patent and Trademark Office, "Notice of Allowance", issued in connection with U.S. Appl. No. 14/178,808, mailed on Sep. 25, 2014, 9 pages.
United States Patent and Trademark Office, "Non-Final Office Action," issued in connection with U.S. Appl. No. 14/184,528, mailed on Mar. 26, 2015, 18 pages.
United States Patent and Trademark Office, "Non-Final Office Action," issued in connection with U.S. Appl. No. 13/705,178, mailed on Mar. 27, 2015, 14 pages.
United States Patent and Trademark Office, "Non-Final Office Action," issued in connection with U.S. Appl. No. 14/504,812, mailed on Jan. 30, 2015, 13 pages.
United States Patent and Trademark Office, "Non-Final Office Action," issued in connection with U.S. Appl. No. 14/290,493, mailed on Jan. 30, 2015, 29 pages.
United States Patent and Trademark Office, "Non-Final Office Action," issued in connection with U.S. Appl. No. 13/871,795, mailed on Jun. 4, 2015, 16 pages.
United States Patent and Trademark Office, "Non-Final Office Action," issued in connection with U.S. Appl. No. 13/435,776, mailed on Mar. 4, 2015, 16 pages.
United States Patent and Trademark Office, "Notice of Allowance," issued in connection with U.S. Appl. No. 13/907,666, mailed on May 19, 2015, 7 pages.
United States Patent and Trademark Office, "Notice of Allowance," issued in connection with U.S. Appl. No. 13/888,203, mailed on Jul. 2, 2015, 19 pages.
Palm, Inc., "Handbook for the Palm VII Handheld," May 19, 2000, 311 pages.
United States Patent and Trademark Office, "Pre-Interview First Office Action," issued in connection with U.S. Appl. No. 14/505,027, mailed on Mar. 10, 2015, 4 pages.
Higgins, Aaron, "Presentations at WinHEC 2000," May 2000, 138 pages.
United States Patent and Trademark Office, "Ex Parte Re-Exam Non-Final Office Action," issued in connection with U.S. Appl. No. 90/013,423, mailed on Apr. 22, 2015, 16 pages.
Renkus-Heinz, "ST-STX Manual," available for sale at least 2004, 6 pages.
Apple, Inc., "Welcome. You're Watching Apple TV: Apple TV 1st Generation Setup Guide," Apr. 8, 2008, Retrieved Oct. 14, 2014, 40 pages.
Apple, Inc., "Welcome. You're Watching Apple TV: Apple TV 2nd Generation Setup Guide," Mar. 10, 2011 retrieved Oct. 16, 2014, 36 pages.
Apple, Inc., "Welcome. You're Watching Apple TV: Apple TV 1st Generation Setup Guide," Mar. 16, 2012 retrieved Oct. 16, 2014, 36 pages.
United States Patent and Trademark Office, "Notice of Allowance," issued in connection with U.S. Appl. No. 13/848,904, mailed on Jul. 2, 2015, 17 pages.
United States Patent and Trademark Office, "Notice of Allowance," issued in connection with U.S. Appl. No. 14/184,935, mailed on Jul. 2, 2015, 23 pages.
United States Patent and Trademark Office, "Notice of Allowance," issued in connection with U.S. Appl. No. 13/297,000, mailed on Jul. 6, 2015, 24 pages.
United States Patent and Trademark Office, "Non-Final Office Action," issued in connection with U.S. Appl. No. 13/848,904, mailed on Oct. 23, 2014, 11 pages.
United States Patent and Trademark Office, "Non-Final Office Action," issued in connection with U.S. Appl. No. 13/864,251, mailed on Oct. 23, 2014, 11 pages.

United States Patent and Trademark Office, "Non-Final Office Action," issued in connection with U.S. Appl. No. 13/888,203, mailed on Oct. 23, 2014, 9 pages.
United States Patent and Trademark Office, "Non-Final Office Action," issued in connection with U.S. Appl. No. 13/435,776, mailed on Oct. 24, 2014, 14 pages.
United States Patent and Trademark Office, "Non-Final Office Action," issued in connection with U.S. Appl. No. 14/186,850, mailed on Feb. 26, 2015, 25 pages.
Canadian Intellectual Property Office, Canadian Office Action mailed on Sep. 14, 2015, issued in connection with Canadian Patent Application No. 2842342, 2 pages.
Notice of Allowance mailed on Oct. 7, 2015, issued in connection with U.S. Appl. No. 14/184,526, filed Feb. 19, 2014, 7 pages.
Notice of Allowance mailed on Oct. 9, 2015, issued in connection with U.S. Appl. No. 13/435,739, filed Mar. 30, 2012, 4 pages.
Notice of Allowance mailed on Oct. 13, 2015, issued in connection with U.S. Appl. No. 13/864,251, filed Apr. 17, 2013, 7 pages.
Advisory Action mailed on Jan. 5, 2012, issued in connection with U.S. Appl. No. 12/035,112, filed Feb. 21, 2008, 3 pages.
Advisory Action mailed on Sep. 28, 2009, issued in connection with U.S. Appl. No. 10/816,217, filed Apr. 1, 2004, 4 pages.
Final Office Action mailed on Oct. 13, 2011, issued in connection with U.S. Appl. No. 12/035,112, filed Feb. 21, 2008, 10 pages.
Non-Final Office Action mailed on Feb. 18, 2009, issued in connection with U.S. Appl. No. 10/861,653, filed Jun. 5, 2004, 18 pages.
First Action Interview Office Action Summary mailed on Apr. 15, 2015, issued in connection with U.S. Appl. No. 14/505,027, filed Oct. 2, 2014, 6 pages.
Non-Final Office Action mailed on Mar. 10, 2011, issued in connection with U.S. Appl. No. 12/035,112, filed Feb. 21, 2008, 12 pages.
Non-Final Office Action mailed on Jun. 27, 2008, issued in connection with U.S. Appl. No. 10/861,653, filed Jun. 5, 2004, 19 pages.
Notice of Allowance mailed on Jun. 14, 2012, issued in connection with U.S. Appl. No. 12/035,112, filed Feb. 21, 2008, 9 pages.
Notice of Allowance mailed on Jun. 16, 2009, issued in connection with U.S. Appl. No. 10/861,653, filed Jun. 5, 2004, 11 pages.
"Notice of Allowance mailed on Sep. 21, 2015, issued in connection with U.S. Appl. No. 13/297,000, filed Nov. 15, 2011, 11 pages.".
"Notice of Allowance mailed on Sep. 22, 2015, issued in connection with U.S. Appl. No. 13/888,203, filed May 6, 2013, 7 pages".
"Notice of Allowance mailed on Sep. 24, 2015, issued in connection with U.S. Appl. No. 13/705,174, filed Dec. 5, 2012, 7 pages.".
"Notice of Allowance mailed on Sep. 24, 2015, issued in connection with U.S. Appl. No. 14/184,935, filed Feb. 20, 2014, 7 pages".
"Notice of Allowance mailed on Aug. 27, 2015, issued in connection with U.S. Appl. No. 13/705,177, filed Dec. 5, 2012, 34 pages.".
"Notice of Allowance mailed on Aug. 27, 2015, issued in connection with U.S. Appl. No. 14/505,027, filed Oct. 2, 2014, 18 pages.".
"Notice of Allowance mailed on Sep. 3, 2015, issued in connection with U.S. Appl. No. 13/705,174, filed Dec. 5, 2012, 4 pages.".
"Notice of Rejection issued on Sep. 15, 2015 in connection with Japanese Patent Application No. 2014-220704, 7 pages.".
"Advisory Action mailed on Jul. 28, 2015, issued in connection with U.S. Appl. No. 14/184,522, filed Feb. 19, 2014, 7 pages.".
"Baudisch et al., "Flat Volume Control: Improving Usability by Hiding the Volume Control Hierarchy in the User Interface", 2004, 8 pages.".
"Chakrabarti et al., "A Remotely Controlled Bluetooth Enabled Environment", IEEE, 2004, pp. 77-81.".
"Schmandt et al., "Impromptu: Managing Networked Audio Applications for Mobile Users", 2004, 11 pages.".
"Final Office Action mailed on Aug. 10, 2015, issued in connection with U.S. Appl. No. 14/290,493, filed May 29, 2014, 26 pages.".
"Final Office Action mailed on Aug. 11, 2015, issued in connection with U.S. Appl. No. 13/864,247, filed Apr. 17, 2013, 15 pages.".
"Final Office Action mailed on Jul. 15, 2015, issued in connection with U.S. Appl. No. 14/504,812, filed Oct. 2, 2014, 18 pages.".
"Final Office Action mailed on Aug. 3, 2015, issued in connection with U.S. Appl. No. 13/848,921, filed Mar. 22, 2013, 13 pages.".
"Fulton et al., "The Network Audio System: Make Your Application Sing (As Well As Dance)!", The X Resource, 1994, 14 pages.".

(56) References Cited

OTHER PUBLICATIONS

"Hans et al., "Interacting with Audio Streams for Entertainment and Communication", 2003, 7 pages.".

"Levergood et al., "AudioFile: A Network-Transparent System for Distributed Audio Applications", Digital Equipment Corporation, 1993, 109 pages.".

"Notice of Allowance mailed on Aug. 10, 2015, issued in connection with U.S. Appl. No. 13/848,904, filed Mar. 22, 2013, 9 pages.".

"Notice of Allowance mailed on Aug. 12, 2015, issued in connection with U.S. Appl. No. 13/435,739, filed Mar. 30, 2012, 27 pages.".

"Notice of Allowance mailed on Jul. 13, 2015, issued in connection with U.S. Appl. No. 14/184,526, filed Feb. 19, 2014, 22 pages.".

"Notice of Allowance mailed on Jul. 15, 2015, issued in connection with U.S. Appl. No. 13/705,174, filed Dec. 5, 2012, 18 pages.".

"Notice of Allowance mailed on Jul. 17, 2015, issued in connection with U.S. Appl. No. 13/864,251, filed Apr. 17, 2013, 20 pages.".

"Notice of Allowance mailed on Jul. 29, 2015, issued in connection with U.S. Appl. No. 13/359,976, filed Jan. 27, 2012, 28 pages.".

"Notice of Allowance mailed on Jul. 29, 2015, issued in connection with U.S. Appl. No. 14/186,850, filed Feb. 21, 2014, 9 pages.".

"Notice of Allowance mailed on Jul. 30, 2015, issued in connection with U.S. Appl. No. 13/705,178, filed Dec. 5, 2012, 18 pages.".

"Notice of Allowance mailed on Aug. 4, 2015, issued in connection with U.S. Appl. No. 14/516,867, filed Oct. 17, 2014, 13 pages.".

"Notice of Allowance mailed on Aug. 5, 2015, issued in connection with U.S. Appl. No. 13/435,776, filed Mar. 30, 2012, 26 pages.".

"Nutzel et al., "Sharing Systems for Future HiFi Systems", IEEE, 2004, 9 pages.".

"Re-Exam Final Office Action mailed on Aug. 5, 2015, issued in connection with U.S. Appl. No. 90/013,423, filed Jan. 5, 2015, 25 pages.".

Corrected Notice of Allowance mailed on Aug. 19, 2015, issued in connection with U.S. Appl. No. 13/907,666, filed May 31, 2013, 2 pages.

Final Office Action mailed Nov. 18, 2015, issued in connection with U.S. Appl. No. 13/533,105, filed Jun. 26, 2012, 56 pages.

United States Patent and Trademark Office, "Advisory Action," issued in connection with U.S. Appl. No. 13/907,666, mailed Sep. 5, 2014, 3 pages.

United States Patent and Trademark Office, "Advisory Action," issued in connection with U.S. Appl. No. 14/516,867, mailed on Jun. 1, 2015, 11 pages.

United States Patent and Trademark Office, "Advisory Action," issued in connection with U.S. Appl. No. 13/907,666, mailed on Nov. 12, 2014, 6 pages.

United States Patent and Trademark Office, "Advisory Action," issued in connection with U.S. Appl. No. 14/184,526, mailed on Apr. 15, 2015, 9 pages.

United States Patent and Trademark Office, "Advisory Action," issued in connection with U.S. Appl. No. 14/184,935, mailed on Apr. 15, 2015, 9 pages.

United States Patent and Trademark Office, "Advisory Action," issued in connection with U.S. Appl. No. 13/848,932, mailed on Mar. 2, 2015, 3 pages.

United States Patent and Trademark Office, "Advisory Action," issued in connection with U.S. Appl. No. 13/533,105, mailed on Mar. 25, 2015, 5 pages.

United States Patent and Trademark Office, "Advisory Action," issued in connection with U.S. Appl. No. 14/184,528, mailed on Feb. 26, 2015, 3 pages.

United States Patent and Trademark Office, "Advisory Action," issued in connection with U.S. Appl. No. 14/186,850, mailed on Nov. 26, 2014, 9 pages.

United States Patent and Trademark Office, "Advisory Action," issued in connection with U.S. Appl. No. 13/705,176, mailed on Jan. 8, 2015, 4 pages.

Baldwin, Roberto, "How-To: Setup iTunes DJ on Your Mac and iPhone", available at http://www.maclife.com/article/howtos/howto_setup_itunes_dj_your_mac_andiphone, archived on Mar. 17, 2009, 4 pages.

Bluetooth, "Specification of the Bluetooth System: The ad hoc SCATTERNET for affordable and highly functional wireless connectivity," Core, Version 1.0 A, Jul. 26, 1999, 1068 pages.

Bluetooth, "Specification of the Bluetooth System: Wireless connections made easy," Core, Version 1.0 B, Dec. 1, 1999, 1076 pages.

Crown, "Network PIP Series Reference Manual," available for sale at least 2004, 68 pages.

Dell, Inc., "Dell Digital Audio Receiver: Reference Guide," Jun. 2000, 70 pages.

Dell, Inc., "Start Here," Jun. 2000, 2 pages.

European Patent Office, "Extended European Search Report," issued in connection with European Patent Application No. 14181454.1, issued on Mar. 31, 2015, 9 pages.

United States Patent and Trademark Office, "Final Office Action," issued in connection with U.S. Appl. No. 14/184,526, mailed on Feb. 11, 2015, 13 pages.

United States Patent and Trademark Office, "Final Office Action," issued in connection with U.S. Appl. No. 14/184,935, mailed on Feb. 11, 2015, 17 pages.

United States Patent and Trademark Office, "Final Office Action," issued in connection with U.S. Appl. No. 14/184,522, mailed on Feb. 12, 2015, 20 pages.

United States Patent and Trademark Office, "Final Office Action," issued in connection with U.S. Appl. No. 14/184,522, mailed on Jun. 15, 2015, 25 pages.

United States Patent and Trademark Office, "Final Office Action," issued in connection with U.S. Appl. No. 13/533,105, mailed on Dec. 17, 2014, 36 pages.

United States Patent and Trademark Office, "Final Office Action," issued in connection with U.S. Appl. No. 14/186,850, mailed on Oct. 22, 2014, 12 pages.

United States Patent and Trademark Office, "Final Office Action," issued in connection with U.S. Appl. No. 13/705,176, mailed on Oct. 23, 2014, 23 pages.

United States Patent and Trademark Office, "Final Office Action," issued in connection with U.S. Appl. No. 14/186,850, mailed on Apr. 28, 2015, 20 pages.

United States Patent and Trademark Office, "Final Office Action," issued in connection with U.S. Appl. No. 14/184,528, mailed on Dec. 3, 2014, 12 pages.

United States Patent and Trademark Office, "Final Office Action," issued in connection with U.S. Appl. No. 13/864,251, mailed on Mar. 3, 2015, 13 pages.

United States Patent and Trademark Office, "Final Office Action," issued in connection with U.S. Appl. No. 13/848,904, mailed on Mar. 4, 2015, 16 pages.

United States Patent and Trademark Office, "Final Office Action," issued in connection with U.S. Appl. No. 13/888,203, mailed on Mar. 5, 2015, 13 pages.

United States Patent and Trademark Office, "Final Office Action," issued in connection with U.S. Appl. No. 13/848,932, mailed on Jan. 7, 2015, 14 pages.

United States Patent and Trademark Office, "Final Office Action," issued in connection with U.S. Appl. No. 14/516,867, mailed on Mar. 9, 2015, 14 pages.

International Bureau, "International Preliminary Report on Patentability and Written Opinion of the International Searching Authority," issued in connection with International Patent Application No. PCT/US2013/046372 on Dec. 31, 2014, 5 pages.

International Bureau, "International Preliminary Report on Patentability and Written Opinion of the International Searching Authority," issued in connection with International Patent Application No. PCT/US2013/046386, mailed on Jan. 8, 2015, 8 pages.

Jones, Stephen, "Dell Digital Audio Receiver: Digital Upgrade for Your Analog Stereo," available at http://www.reviewsonline.com/articles/961906864.htm, Jun. 24, 2000, retrieved on Jun. 18, 2014, 2 pages.

(56) References Cited

OTHER PUBLICATIONS

Louderback, Jim, "Affordable Audio Receiver Furnishes Homes With MP3," TechTV Vault, available at http://www.g4tv.com/articles/17923/affordable-audio-receiver-furnishes-home-with-mp3/, Jun. 28, 2000, retrieved on Jul. 10, 2014, 2 pages.

United States Patent and Trademark Office, "Non-Final Office Action," issued in connection with U.S. Appl. No. 14/184,935, mailed Jul. 25, 2014, 10 pages.

United States Patent and Trademark Office, "Non-Final Office Action," issued in connection with U.S. Appl. No. 14/516,867, mailed on Dec. 1, 2014, 11 pages.

United States Patent and Trademark Office, "Non-Final Office Action," issued in connection with U.S. Appl. No. 13/848,932, mailed on Jun. 12, 2015, 16 pages.

United States Patent and Trademark Office, "Non-Final Office Action," issued in connection with U.S. Appl. No. 13/705,174, mailed on Mar. 12, 2015, 13 pages.

United States Patent and Trademark Office, "Non-Final Office Action," issued in connection with U.S. Appl. No. 13/705,177, mailed on Mar. 13, 2015, 15 pages.

United States Patent and Trademark Office, "Non-Final Office Action," issued in connection with U.S. Appl. No. 13/864,247, mailed on Nov. 17, 2014, 11 pages.

United States Patent and Trademark Office, "Non-Final Office Action," issued in connection with U.S. Appl. No. 13/435,739, mailed on Nov. 18, 2014, 10 pages.

United States Patent and Trademark Office, "Non-Final Office Action," issued in connection with U.S. Appl. No. 13/533,105, mailed on Jun. 19, 2015, 38 pages.

United States Patent and Trademark Office, "Non-Final Office Action," issued in connection with U.S. Appl. No. 13/848,921, mailed on Nov. 19, 2014, 9 pages.

United States Patent and Trademark Office, "Non-Final Office Action," issued in connection with U.S. Appl. No. 13/705,176, mailed on Jun. 23, 2015, 30 pages.

SYSTEMS AND METHODS FOR SYNCHRONIZING OPERATIONS AMONG A PLURALITY OF INDEPENDENTLY CLOCKED DIGITAL DATA PROCESSING DEVICES WITHOUT A VOLTAGE CONTROLLED CRYSTAL OSCILLATOR

CROSS-REFERENCE TO RELATED APPLICATIONS

The present application is a continuation of U.S. application Ser. No. 14/176,808, filed on Feb. 10, 2014; U.S. application Ser. No. 14/176,808 is a continuation of U.S. application Ser. No. 13/724,048, filed on Dec. 21, 2012, and issued on Apr. 1, 2014, as U.S. Pat. No. 8,689,036; U.S. application Ser. No. 13/724,048 is a continuation of U.S. application Ser. No. 13/204,511, filed on Aug. 5, 2011, and issued on Feb. 5, 2013, as U.S. Pat. No. 8,370,678; U.S. application Ser. No. 13/204,511 is a continuation of U.S. application Ser. No. 11/801,468, filed on May 9, 2007, and issued on Sep. 13, 2011, as U.S. Pat. No. 8,020,023; U.S. application Ser. No. 11/801,468 is a continuation-in-part of U.S. application Ser. No. 10/816,217 filed on Apr. 1, 2004, and issued on Jul. 31, 2012, as U.S. Pat. No. 8,234,395, and claims priority to U.S. Provisional App. No. 60/860,964 filed on Nov. 22, 2006, and U.S. Provisional App. No. 60/876,455 filed on Dec. 20, 2006; U.S. application Ser. No. 10/816,217 claims priority to U.S. Provisional App. 60/490,768 filed on Jul. 28, 2003. The entire contents of U.S. application Ser. Nos. 14/176,808; 13/724,048; 13/204,511; 11/801,468; 10/816,217; 60/860,964; 60/876,455; and 60/490,768 are incorporated herein by reference.

FIELD OF THE INVENTION

The present invention relates generally to digital content, and more particularly, to systems and methods for synchronizing operations among a plurality of independently clocked digital data processing devices without a voltage controlled crystal oscillator.

DESCRIPTION OF RELATED ART

Conventionally, playing the same digital content over multiple audio and/or audiovisual reproduction devices simultaneously or in synchrony is limited by the inherent differences in the frequencies or clock rates of the crystal oscillators influencing the rates in which the digital content is converted to analog content for playing over the respective audio and/or audiovisual reproduction devices. Previous approaches that solve this problem require expensive hardware and/or circuitry, which also requires additional space within the audio and/or audiovisual reproduction device. There is thus a need for systems and methods for synchronizing operations among a plurality of independently clocked digital data processing devices without a voltage controlled crystal oscillator.

SUMMARY OF THE INVENTION

Exemplary systems and methods are provided that include a distribution device that maintains a clock rate and distributes a series of tasks to a group of execution devices (or synchrony group). Each task has a plurality of samples per frame associated with a time stamp indicating when the task is to be executed. An execution device executes the series of tasks at the times indicated and adjusts the number of samples per frame in relation to the clock rate maintained by the distribution device. The synchrony group may also be configured to adjust samples per frame in relation to a clock rate maintained by the distribution device.

DETAILED DESCRIPTION

Figure 1:
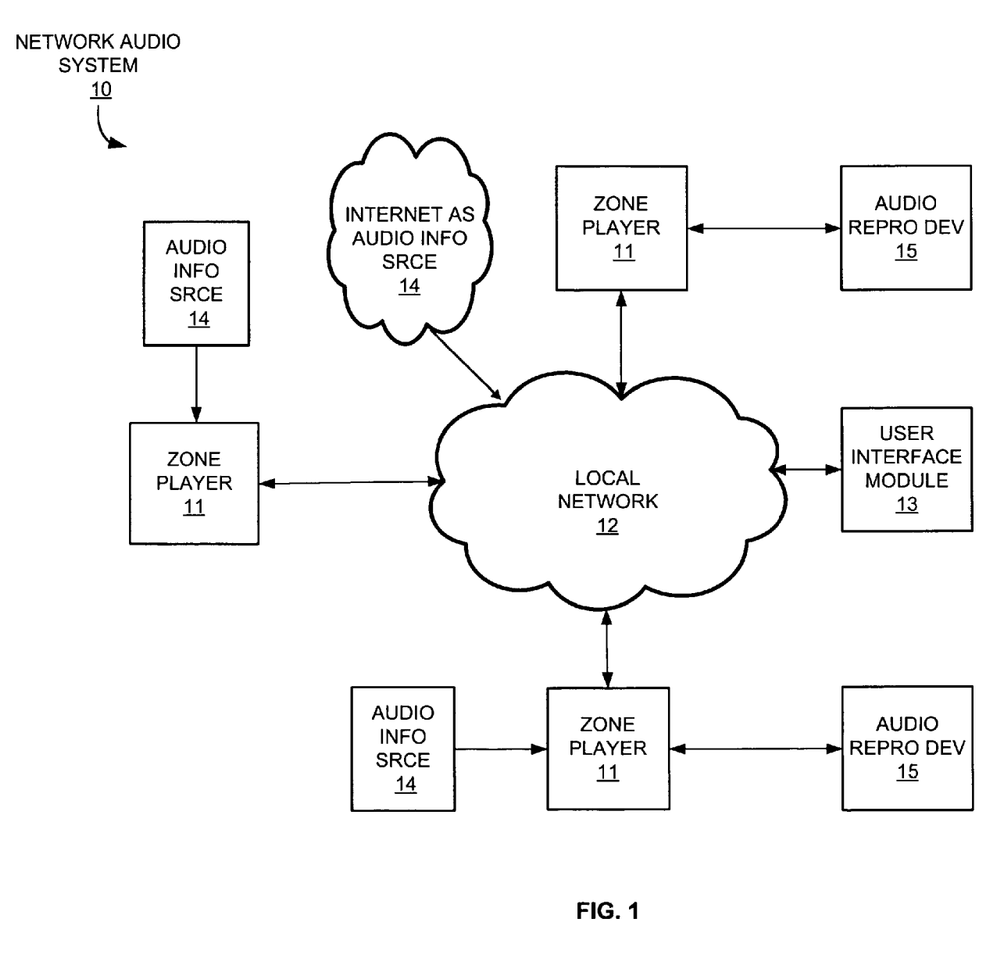
FIG. 1 illustrates an exemplary networked system.

Referring to FIG. 1, an exemplary network audio system 10 is shown in which various embodiments of the invention may be practiced. Although the term "audio" is used in connection with the exemplary network audio system 10, it will readily be appreciated that the herein described systems and methods may be employed with other forms of digital data, including visual and/or audiovisual digital data.

The exemplary network audio system 10 includes at least one zone player 11, interconnected by a local network 12, all of which may operate under the control of one or more user interface modules identified by reference numeral 13. The zone player 11 is sometimes referred to as a digital data processing device. One or more of the zone players 11 may also be connected to one or more audio information sources, which will generally be identified herein by reference numeral 14, and/or connected to one or more audio reproduction devices, which will generally be identified by reference numeral 15. It will be appreciated that the number of audio information sources may vary as among the various zone players 11, and some zone players may not have any audio information sources connected thereto.

A plurality of zone players 11 associated with a network audio system 10 may be distributed throughout an establishment, such as residence, an office complex, a hotel, a conference hall, an amphitheater, auditorium, or other types of establishments as will be apparent to those skilled in the art. For example, a zone player 11 and its associated audio information source(s) and audio reproduction device(s) may be located in a living room, another zone player may be located in a kitchen, another zone player may be located in a dining room, and other zone players may be located in bedrooms, to selectively provide entertainment in those rooms. The audio information sources 14 may be any of a number of types of conventional sources of audio information, including, for example, compact disc ("CD") players, AM and/or FM radio receivers, analog or digital tape cassette players, analog record turntables and the like. In addition, the audio information sources 14 may comprise digital audio files stored locally on, for example, personal computers (PCs), personal digital assistants (PDAs), or similar devices capable of storing digital information in volatile or non-volatile form. The audio information sources 14 may also comprise an interface to a wide area network such as the Internet, or any other source of audio information, or an interface to radio services delivered over, for example, satellite. Audio information obtained over the wide area network may comprise, for example, streaming digital audio information such as Internet radio, digital audio files stored on servers, and other types of audio information and sources as will be appreciated by those skilled in the art.

Generally, the audio information sources 14 provide audio information associated with audio programs to the zone players for playback. A zone player that receives audio information from an audio information source 14 that is connected thereto may provide playback and/or forward the audio information, along with playback timing information, over the local network 12 to other zone players for playback. Users, using user interface module 13, may also enable different groupings or sets of zone players to provide audio playback of different audio programs synchronously.

Figure 2:
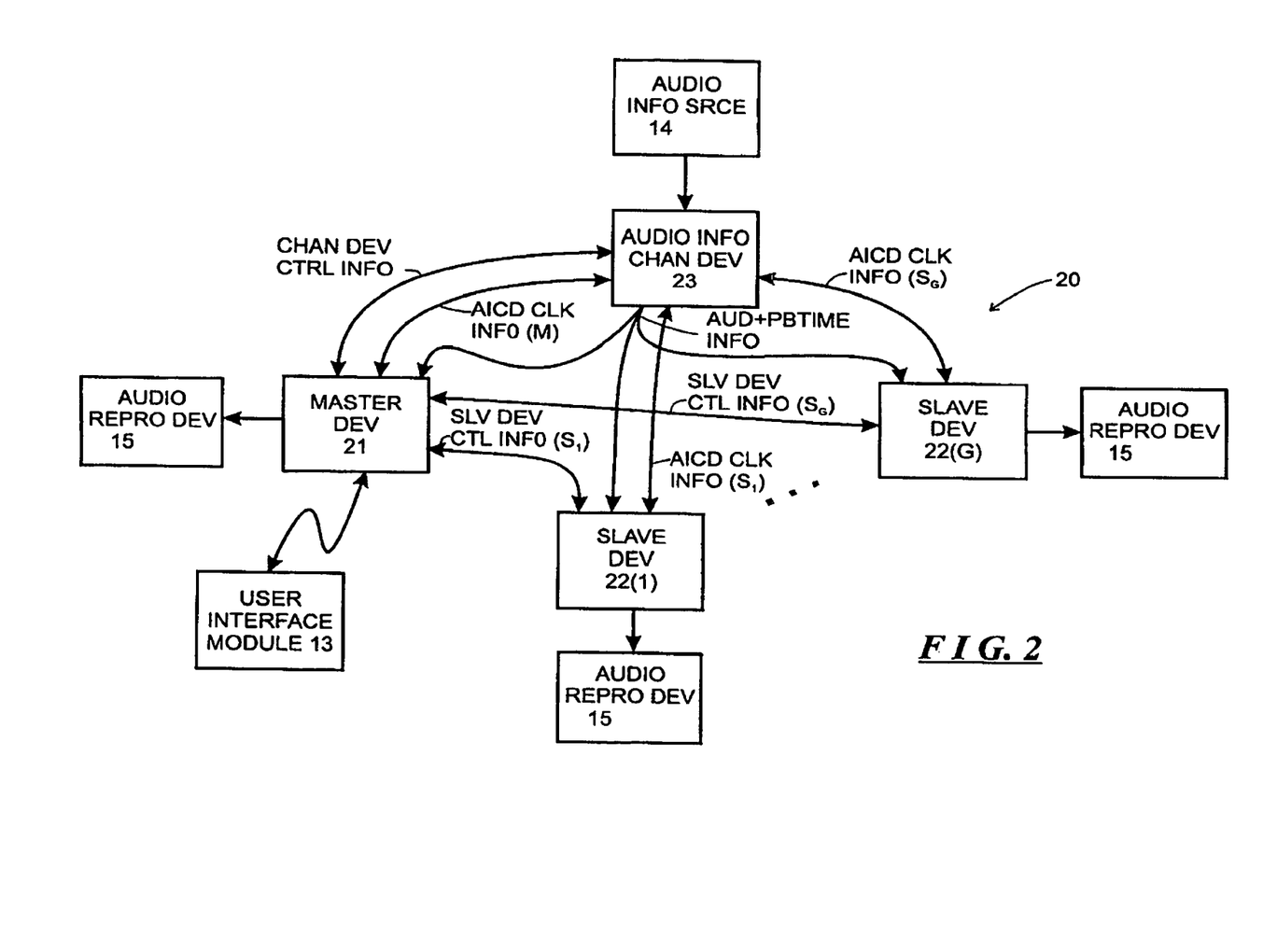
FIG. 2 illustrates a functional block diagram of a synchrony group utilizing a plurality of zone players formed within the exemplary networked system depicted in FIG. 1.

Referring to FIG. 2, an exemplary group of execution devices (or "synchrony group") 20 according to one embodiment of the invention is shown. The exemplary synchrony group 20 comprises synchrony group member devices or member devices including a master execution device 21 and zero or more slave devices 22(1) through 22(G) (generally identified by reference numeral 22(g)), all of which synchronously play an audio program provided by an audio information channel device 23. The audio information channel device 23 is sometimes referred to as a task source or a task distribution device. Each master execution device 21, slave device 22(g), and/or audio information channel device 23 may utilize a zone player 11 as depicted in FIG. 1. The zone player 11 may function as an audio information channel device 23, a master execution device 21, or a slave device 22(g) for the synchrony group 20. The audio information channel device 23 may obtain audio information for the audio program from an audio information source 14, add playback timing information, and transmit the combined audio and playback timing information to the master execution device 21 and slave devices 22(g) over local network 12 (FIG. 1) for playback. The playback timing information that is provided with the audio information, together with clock timing information provided by the audio information channel device 23 to the various devices 21 and 22(g), enables the master execution device 21 and slave devices 22(g) of the synchrony group 20 to play the audio information simultaneously.

The master execution device 21 and the slave devices 22(g) receive the audio and playback timing information, as well as the clock timing information, that are provided by the audio information channel device 23, and play back the audio program defined by the audio information. The master execution device 21 also communicates with the user interface module 13, controls the operations of the slave devices 22(g) in the synchrony group 20, and controls the operations of the audio information channel device 23 that provides the audio and playback timing information for the synchrony group 20. Generally, the initial master execution device 21 for the synchrony group will be the first zone player 11 that a user wishes to play an audio program. However, the master execution device 21 may be migrated from a first zone player to a second zone player, which preferably will be a zone player that is currently operating as a slave device 22(g) in the synchrony group.

In addition, under certain circumstances, the audio information channel device 23 may be migrated from one zone player to another zone player, which also may be a zone player that is currently operating as a member of the synchrony group 20. It will be appreciated that the zone player that operates as the master execution device 21 may be migrated to another zone player independently of the migration of the audio information channel device 23. For example, if a first zone player is operating as both the master execution device 21 and the audio information channel device 23 for a synchrony group 20, the function of the master execution device 21 may be migrated to a second zone player while the first zone player is still operating as the audio information channel device 23. Similarly, if a first zone player is operating as both the master execution device 21 and the audio information channel device 23 for a synchrony group 20, the source function of the audio information channel device 23 may be migrated to a second zone player while the first zone player is still operating as the master execution device 21. In addition, if a first zone player is operating as both the master execution device 21 and the audio information channel device 23 for a synchrony group 20, the master execution device 21 may be migrated to a second zone player and the audio information channel device may be migrated to a third zone player.

The master execution device 21 receives control information from the user interface module 13 for controlling the synchrony group 20 and provides status information indicating the operational status of the synchrony group 20 to the user interface module 13. Generally, the control information from the user interface module 13 causes the master execution device 21 to enable the audio information channel device 23 to provide audio and playback timing information to the synchrony group, allowing the devices 21 and 22(g) that are members of the synchrony group 20 to play the audio program synchronously. In addition, the control information from the user interface module 13 causes the master execution device 21 to enable other zone players to join the synchrony group as slave devices 22(g) and/or to cause slave devices 22(g) to disengage from the synchrony group. Control information from the user interface module 13 may also cause the zone player 11 that is currently operating as the master execution device 21 to disengage from the synchrony group, but prior to doing so, that zone player will cause the function of the master execution device 21 to transfer from that zone player 11 to a second zone player, preferably to a second zone player that is currently a slave device 22(g) in the synchrony group 20. The control information from the user interface module 13 may also cause the master execution device 21 to adjust its playback volume and/or to enable individual ones of the various slave devices 22(g) to adjust their playback volumes. In addition, the control information from the user interface module 13 may cause the synchrony group 20 to terminate playing of a current track of the audio program and skip to the next track, and to re-order tracks in a play list of tracks defining the audio program that are to be played by the synchrony group 20. The status information that the master execution device 21 may provide to the user interface module 13 may include such information as a name or other identifier for the track of an audio work that is currently being played, the names or other identifiers for upcoming tracks, the identifier of the zone player 11 that is currently operating as the master execution device 21, and identifiers of the zone players that are currently operating as slave devices 22(g). In one embodiment, the user interface module 13 may include a display that can display the status information to the user. It will be appreciated that the zone player 11 that is operating as the audio information channel device 23 for one synchrony group may also comprise the master execution device 21 or any of the slave devices 22(g) in another synchrony group. This may occur if, for example, the audio information source that is to provide the audio information that is to be played by the one synchrony group is connected to a zone player also being utilized as the master execution device or a slave device for the other synchrony group.

Figure 3:
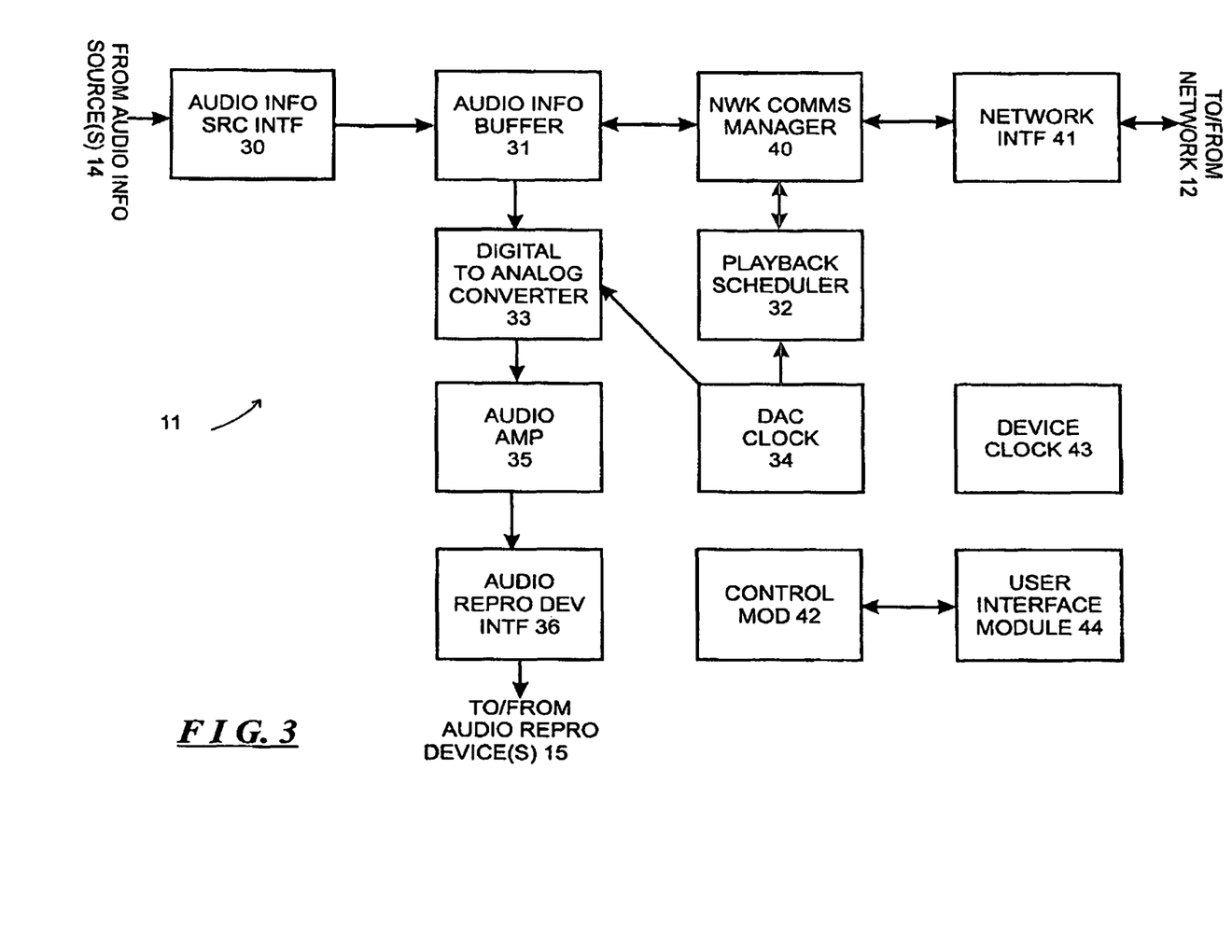
FIG. 3 illustrates a functional block diagram of a zone player for use in the networked system depicted in FIG. 1.

Referring to FIG. 3, a functional block diagram of an exemplary zone player 11 constructed in accordance with one embodiment of the invention is shown. The exemplary zone player 11 includes an audio information source interface 30, an audio information buffer 31, a playback scheduler 32, a digital to analog converter 33, an audio amplifier 35, an audio reproduction device interface 36, a network communications manager 40, a network interface 41, and a control module 42. In an alternative system and method, the exemplary zone player 11 may not include the audio amplifier 35. In a further embodiment, the zone player 11 includes and/or forms part of the audio reproduction device 15. The zone player 11 also has a device clock 43 that provides timing signals that control the general operations of the zone player 11. In addition, the zone player 11 includes a user interface module interface 44 that can receive control signals from the user interface module 13 (FIGS. 1 and 2) for controlling operations of the zone player 11, and provides status information to the user interface module 13.

Generally, the audio information buffer 31 buffers audio information, in digital form, along with playback timing information. If the zone player 11 is operating as the audio information channel device 23 (FIG. 2) for a synchrony group 20, the information that is buffered in the audio information buffer 31 may include the audio and playback timing information that will be provided to the devices 21 and 22(g) in the synchrony group 20. If the zone player 11 is operating as the master execution device 21 or a slave device 22(g) for a synchrony group (20), the information that is buffered in the audio information buffer 31 may include the audio and playback timing information that the zone player 11 is to play. The audio information buffer 31 may receive audio and playback timing information from two sources, namely, the audio information source interface 30 and the network communications manager 40. In particular, if the zone player 11 is operating as the audio information channel device 23 for a synchrony group 20, and if the audio information source is a source 14 connected to the zone player 11, the audio information buffer 31 may receive and buffer audio and playback timing information from the audio information source interface 30. Alternatively, if the zone player 11 is operating as the audio information channel device 23 for a synchrony group 20, and if the audio information source is a source 14 connected to the network 12, or a source available over a wide area network, the audio information buffer 31 may receive and buffer audio and playback timing information from the network communications manager 40. However, if the zone player 11 is operating as the master execution device 21 or a slave device 22(g) in a synchrony group 20, and if the zone player 11 is not also the audio information channel device 23 providing audio and playback timing information for the synchrony group 20, the audio information buffer 31 may receive and buffer audio and playback timing information from the network communications manager 40. It will be appreciated that, if the zone player 11 is not a member of the synchrony group, the zone player 11 may not play this buffered audio and playback timing information.

According to some embodiments, the audio information source interface 30 connects to the audio information source(s) 14 associated with the zone player 11. While the zone player 11 is operating as the audio information channel device 23 for a synchrony group 20, and if the audio information is to be provided by a source 14 connected to the zone player 11, the audio information source interface 30 will selectively receive audio information from one of the audio information source(s) 14 to which the zone player is connected and store the audio information in the audio information buffer 21. If the audio information from the selected audio information source 14 is in analog form, the audio information source interface 30 will convert it to digital form. The selection of the audio information source 14 from which the audio information source interface 30 receives audio information is under the control of the control module 42, which, in turn, receives control information from the user interface module through the user interface module interface 44. The audio information source interface 30 adds playback timing information to the digital audio information and buffers the combined audio and playback timing information in the audio information buffer 21. More specifically, the audio information source interface 30 receives audio information from an audio information source 14, converts it to digital form if necessary, and buffers it along with playback timing information in the audio information buffer 21. In addition, the audio information source interface 30 may also provide formatting and scheduling information for the digital audio information, whether as received from the selected audio information source 14 or as converted from an analog audio information source. The formatting and scheduling information will control not only playback by the zone player 11 itself, but will also enable other zone players that may be in a synchrony group for which the zone player 11 is the master execution device to play the audio program associated with the audio information in synchrony with the zone player 11.

In one particular embodiment, the audio information source interface 30 divides the audio information associated with an audio work into a series of frames, with each frame comprising digital audio information for a predetermined period of time. As used herein, an audio track may comprise any unit of audio information that is to be played without interruption, or a series of one or more audio tracks that are to be played in succession. It will be appreciated that the tracks comprising the audio program may also be played without interruption, or alternatively playback between tracks may be interrupted by a selected time interval.

Figure 4:
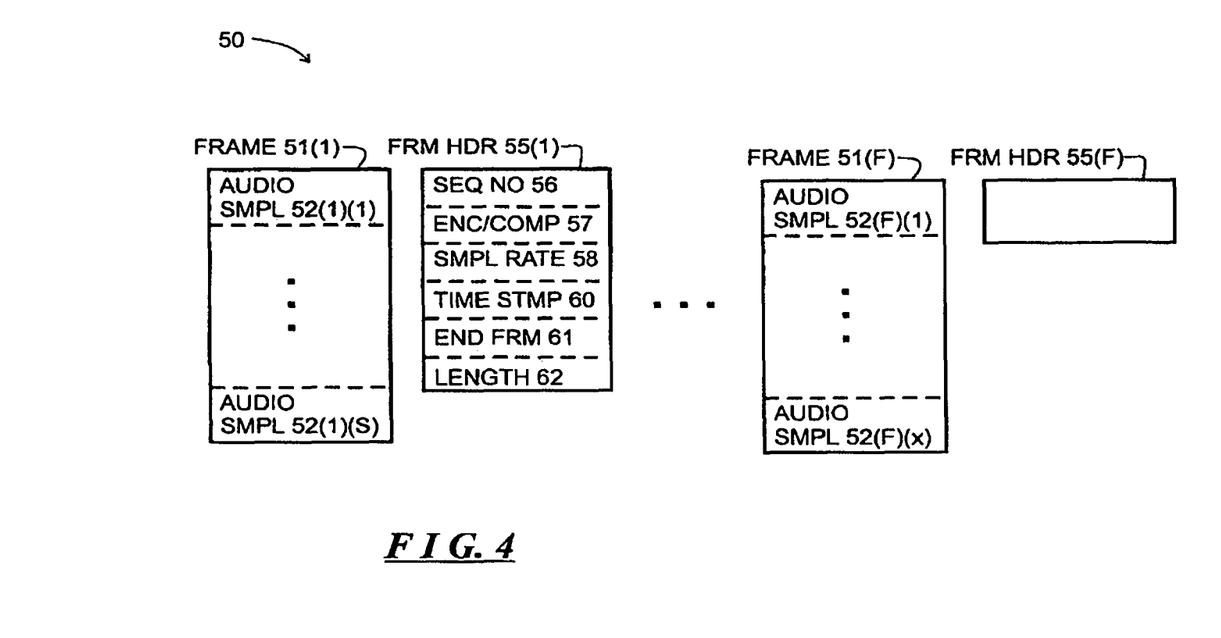
FIG. 4 illustrates an exemplary digital framing methodology.

FIG. 4 depicts an illustrative framing strategy used in connection with one system and method of the invention for a digital audio stream comprising an audio work. A framed digital audio stream 50 comprises a sequence of frames 51(1) through 51(F) (generally identified by reference numeral 51(f)). Here, "(f)" may represent a generic sequence number for any particular frame (51), with the actual sequence numbers ranging from "(1)" to "(F)." Each frame 51(f), in turn, comprises a series of audio samples 52(f)(1) through 52(f)(S) (generally identified by reference numeral 52(f)(s)) of the audio track. The number of audio samples 52(f)(s) may differ in each frame 51(f). Associated with each frame 51(f) is a header 55(f) that includes a number of fields for storing other information that is useful in controlling playback of the audio samples in the respective frame 51(f). In particular, the header 55(f) associated with a frame 51(f) includes a frame sequence number field 56, an encoding type field 57, a sampling rate information field 58, a time stamp field 60, an end of track flag 61, and a length flag field 62. The header 55(f) may also include fields for storing other information that is useful in controlling playback.

Generally, the frame sequence number field 56 receives a number which will generically be the number "f," from the range 1 through F as above, that identifies the relative position of the frame 51(f) in the sequence of frames containing the digital audio stream 50. The encoding type field 57 receives a value that identifies the type of encoding and/or compression that has been used in generating the digital audio stream. Conventional encoding or compression schemes include, for example, MP3 and WAV encoding and/or compression schemes, although it will be appreciated that other schemes may be provided for as well. The sampling rate information field 58 includes sampling rate information that may indicate the sampling rate relative to the audio information channel device 23 and/or the sampling rate relative to a current inherent, clock rate of a synchrony group member. The condition of the end of work flag 61 indicates whether the frame 51(*f*) contains the last digital audio samples for the audio track associated with the framed digital audio work 50. If the frame 51(*f*) does not contain the audio samples that are associated with the end of the digital audio stream 50 for a respective audio work, the end of work flag will be clear. On the other hand, if the frame 51(*f*) does contain the audio samples that are associated with the end of the digital audio stream 50 for a respective audio work, the end of work flag 61 will be set. In addition, the length flag field 62 will contain a value that identifies the number of audio samples in the last frame 51(F) of the audio work 50. The time stamp field 60 stores a time stamp that identifies the time at which the zone player 11 is to play the respective frame.

Within each synchrony group member, for each frame of a framed digital audio stream 50 that is buffered in the audio information buffer 21, the audio information source interface 30, using timing information from the digital to analog converter clock 34, may determine a time at which the zone player 11 is to play the respective frame, and will store a time stamp identifying the playback time in the time stamp field 60. The time stamp associated with each frame is used by the playback scheduler 32 to determine when the portion of the digital audio stream stored in the frame is to be coupled to the digital to analog converter 33 to initiate play back. It will be appreciated that the time stamps that are associated with each of the frames in sequential frames will be such that they will be played back in order, and without an interruption between the sequential frames comprising the digital audio stream 50. It will further be appreciated that, after a time stamp has been determined for the first frame and stored in frame 51(1) of a digital audio stream 50, the audio information source interface 30 may determine time stamps for the subsequent frames in relation to the number of samples in the respective frames and the current inherent clock rate of the synchrony group member. The time stamps will also preferably be such that frames will be played back after some slight time delay after they have been buffered in the audio information buffer 21.

In some embodiments, the zone players 11 are provided with a digital to analog converter clock 34 whose time may be set by an element such as the network communications manager 40. When a zone player 11 is operating as a member of a synchrony group 20, its network communications manager 40 may use the various types of timing information that it receives from the audio information channel device 23 to adjust the time value of the synchrony group member's digital to analog converter clock 34. If the clock's time value is to be adjusted, when the synchrony group member's network communications manager 40 initially receives the current time information from the audio information channel device 23 for the synchrony group 20, the network communications manager 40 may set the synchrony group member's digital to analog converter clock 34 to the current time value as indicated by the audio information channel device's current time information 23. The network communications manager 40 may set the digital to analog converter clock 34 to the current time value indicated by the audio information channel device's current time information once, or periodically as it receives the current time information.

After the network communications manager 40 receives a frame 51(*f*) from the network interface 41, it may also obtain, from the digital to analog converter clock 34, the zone player 11's current time as indicated by its digital to analog converter clock 34. The network communications manager 40 may determine a time differential value that is the difference between the slave device's current clock time, as indicated by its digital to analog converter clock 34, and the audio information channel device's time as indicated by the audio information channel device's clock timing information. Accordingly, if the slave device's current time has a value TS and the audio information channel device's current time, as indicated by the clock timing information, has a value TC, the time differential value $\Delta T=TS-TC$. If the current time of the slave device in the synchrony group 20, as indicated by its digital to analog converter clock 34, is ahead of the audio information channel device's clock time, the time differential value will have a positive value. On the other hand, if the slave device's current time is behind the audio information channel device's clock time, the time differential value $\Delta T$ will have a negative value. If the zone player 11 obtains clock timing information from the audio information channel device 23 periodically while it is a member of the synchrony group 20, the network communications manager 40 may generate an updated value for the time differential value $\Delta T$ when it receives the clock timing information from the audio information channel device 23, and may subsequently use the updated time differential value.

The network communications manager 40 may use the time differential value $\Delta T$ that it generates from the audio information channel device timing information and zone player 11's current time to update the time stamps that will be associated with the digital audio information frames that the zone player 11 receives from the audio information channel device. For each digital audio information frame that is received from the audio information channel device, instead of storing the time stamp that is associated with the frame as received in the message in the audio information buffer 21, the network communications manager 40 will store the updated time stamp with the digital audio information frame. The updated time stamp is generated in a manner so that, when the zone player 11, as a member of the synchrony group plays back the digital audio information frame, it will do so in synchrony with other devices in the synchrony group.

The network communications manager 40 may utilize the updated time stamps associated with respective frames 51(*f*) to accommodate the current inherent clock rate of the digital to analog converter clock 34 of the synchrony group member. For example, when the synchrony group member's network communications manager 40 receives a first frame 51(1) having a time stamp having a time value T, it can generate an updated time value TU, and store the frame 51(1) with the updated time value TU in the audio information buffer 31 (e.g., 51(1)TU). In addition, since both the number of samples in a frame and the current inherent clock rate of the digital to analog converter clock 34, which determines the rate at which the samples in a frame are to be played by the synchrony group member, are known to the network communications manager 40, the network communications manager 40 can use that information, along with the time value TU to generate an expected or predicted time value TE for the time stamp of the next frame 51(2). After the synchrony group member's network communications manager 40 receives frame 51(2), it can generate the updated time value TU for frame 51(2) and compare that time value to the time value TE that was predicted for frame 51(2). If the two time values do not correspond, or if the difference between them is above a selected threshold level, the clock that is used by the audio information channel device 23 to generate the time stamps is advancing at a different rate than the synchrony group member's digital to analog converter clock 34, and the network communications manager 40 may adjust the number of samples per frame to accommodate the current inherent clock rate of the digital to analog converter clock 34 of the synchrony group member. If the two time values do correspond (e.g., 51(2)TE=51(2)TU), or the difference is below a threshold level, the time differential value is constant, and the network communications manager 40 need not accommodate the current inherent clock rate of the digital to analog converter clock 34 of the synchrony group member.

As an example of one way the network communications manager 40 adjusts the number of samples in one or more frames to accommodate the current inherent clock rate of the digital to analog converter clock 34 of a synchrony group member, consider a situation where the clock used by an audio information channel device 23 indicates a sampling rate of 44105 samples per second for the audio information channel device 23. A synchrony group member with a digital to analog converter clock 34 operating at a current inherent clock rate of 44100 samples per second will require the network communications manager 40 for the synchrony group member to reduce the number of samples in one or more frames by five samples for each one second interval that a particular track(s) comprising one or more frames are being played by the synchrony group member.

Continuing this example, a second synchrony group member with a digital to analog converter clock 34 operating at a current inherent clock rate of 44110 samples per second will require the network communications manager 40 for the second synchrony group member to increase the number of samples in one or more frames by five samples for each one second interval that a particular track(s) comprising one or more frames is being played by the second synchrony group member. As a result of the independent adjustments taking place within the first and second synchrony group members in relation to their shared audio information channel device 23, both synchrony group members will be playing the same or nearly the same frame at the same time, despite the differences in their respective current inherent clock rates.

An information channel device 23 may be configured to periodically receive the respective current inherent clock rates of one or more synchrony group members comprising a synchrony group. Using this information, the audio information channel device 23 performs the requisite adjustments (instead of the respective one or more synchrony group members) and sends one or more tracks to each synchrony group member, wherein the one or more tracks are adjusted to accommodate the current inherent clock rates of the respective synchrony group members. Accordingly, as a result of the multiple adjustments taking place within the audio information channel device 23 with respect to the current inherent clock rates of the one or more synchrony group members, all synchrony group members may play the same or nearly the same frame at the same time, despite the differences in their respective current inherent clock rates.

The exemplary zone player 11 serving as a synchrony group member may or may not include an audio amplifier 35 (FIG. 3). Further, as described herein, an audio information channel device 23 may perform the requisite sample adjustments or each synchrony group member may perform the requisite sample adjustments. Provided the synchrony group member and/or the audio reproduction device 15 (that is wired or wirelessly associated with the synchrony group member) includes at least one amplifier, regardless of scenario, the audio reproduction device 15 may adapt and maintain as constant a current inherent clock rate of the synchrony group member. Accordingly, the audio reproduction device 15 may play the same or nearly the same frame at the same time as another synchrony group member. This may be advantageous, because some audio reproduction devices 15 may be incapable of making timely clock rate adjustments.

Consequently, by adjusting samples per frame, some exemplary systems and methods as described herein may function with audio reproduction devices 15 that would otherwise be incompatible with those systems and methods that include clock rate adjustments for achieving a synchronous performance.

While various systems and methods have been described above, it should be understood that they have been presented by way of example only, and not limitation. Thus, the breadth and scope of a preferred embodiment should not be limited by any of the above-described exemplary systems and methods.

The invention claimed is:

1. A digital data processing device included in a synchrony group of one or more digital data processing devices, the digital data processing device comprising:
    an interface configured to receive multimedia information arranged as a plurality of frames, each frame to include one or more samples and an indication of when to play the one or more samples in a frame, the multimedia information to be played in synchrony with the synchrony group;
    an information buffer configured to store the plurality of frames for play back by the digital data processing device,
    wherein the digital data processing device is configured to receive clock information from a source device and determine a time differential value between the received clock information and clock information associated with the digital data processing device, the time differential value to be applied with the indication of when to play each of the plurality of frames to generate an updated indication of when to play each of the plurality of frames to be stored in the information buffer; and
    an output configured to play back one or more samples in a frame from the information buffer according to the updated indication of when to play the frame,
    wherein the digital data processing device is configured to adjust, independent of another device in the synchrony group and based on a comparison between the updated indication of when to play the frame and a predicted time value for play back of the frame, a number of samples per frame that are to be played.

2. The digital data processing device of claim 1, further comprising a network communications manager configured to receive the plurality of frames from an audio information source.

3. The digital data processing device of claim 1, wherein the adjustment of the number of samples per frame is also based on a clock rate of the digital data processing device.

4. The digital data processing device of claim 1, wherein the digital data processing device is among a group of digital data processing devices in the synchrony group and is configured as a master execution device configured to control distribution of information among the synchrony group.

5. The digital data processing device of claim 1, further comprising a user interface to configured control the digital data processing device.

6. The digital data processing device of claim 1, wherein the digital data processing device is configured to enable another digital data processing device to join the synchrony group.

7. The digital data processing device of claim 1, wherein the digital data processing device is configured to transfer an ability to control the digital data processing device such that another digital data processing device becomes a master execution device.

8. A method for synchronizing audio playback among playback devices in a synchrony group comprising a plurality of audio playback devices, the method comprising:

receiving, by a playback device in the synchrony group, audio information including a plurality of frames from a source device over a network, the audio information to be played in synchrony with the synchrony group, wherein each frame of the plurality of frames includes one or more audio samples and an indication of when to play the one or more audio samples of the respective frame;

updating the indication of when to play each of the plurality of frames using a time differential value determined between clock information received from the source device and clock information associated with the playback device;

storing the updated indications of when to play each of the plurality of frames; and outputting audio information based on the plurality of frames and associated updated indications via the playback device; and adjusting, independent of another device in the synchrony group and based on a comparison between the updated indication of when to play the frame and a predicted time value for play back of the frame, a number of samples per frame to be output.

9. The method of claim 8, further comprising enabling the playback device to function as a master execution device configured to control distribution of information among the synchrony group.

10. The method of claim 9, further comprising enabling an additional playback device to join the synchrony group.

11. The method of claim 9, wherein audio information is distributed to the synchrony group using a multi-cast transmission methodology.

12. The method of claim 9, further comprising migrating distribution of audio information from one playback device to another playback device.

13. The method of claim 9, further comprising distributing audio information to a second group of playback devices.

14. The method of claim 8, further comprising generating the predicted time value for the frame using the updated indication of when to play a previous frame and a clock rate of the playback device.

15. The method of claim 8, wherein the comparison further comprises comparing whether a difference between the updated indication of when to play and the predicted time value exceeds a threshold level.

16. A tangible, non-transitory computer-readable storage device including instructions executable by a processor, the instructions, when executed by the processor, configure the processor as a digital data processing device included in a synchrony group of one or more devices, the digital data processing device comprising:

an interface configured to receive multimedia information arranged as a plurality of frames, each frame to include one or more samples and an indication of when to play the one or more samples in a frame, the multimedia information to be played in synchrony with the synchrony group;

an information buffer configured to store the plurality of frames for play back by the digital data processing device, wherein the digital data processing device is configured to receive clock information from a source device and determine a time differential value between the received clock information and clock information associated with the digital data processing device, the time differential value to be applied to the indication of when to play each of the plurality of frames to generate an updated indication of when to play each of the plurality of frames to be stored in the information buffer; and an output configured to play back one or more samples in a frame from the information buffer according to the updated indication of when to play the frame, wherein the digital data processing device is configured to adjust, independent of another device in the synchrony group and based on a comparison between the updated indication of when to play the frame and a predicted time value for play back of the frame, a number of samples per frame that are to be played.

17. The tangible, non-transitory computer-readable storage medium of claim 16, wherein the adjustment of the number of samples per frame is also based on a clock rate of the digital data processing device.

18. The tangible, non-transitory computer-readable storage medium of claim 16, wherein the digital data processing device is among a group of digital data processing devices in the synchrony group and is to be designated as a master execution device configured to control distribution of information among the synchrony group.

19. The tangible, non-transitory computer-readable storage medium of claim 16, wherein the digital data processing device is configured to enable another digital data processing device to join the synchrony group.

20. The tangible, non-transitory computer-readable storage medium of claim 16, wherein the digital data processing device is configured to transfer an ability to control the digital data processing device such that another digital data processing device becomes a master execution device.

* * * * *